(12) United States Patent
Akagawa et al.

(10) Patent No.: US 11,394,008 B2
(45) Date of Patent: Jul. 19, 2022

(54) ORGANIC ELECTROLUMINESCENCE DEVICE, METHOD FOR MANUFACTURING ORGANIC ELECTROLUMINESCENCE DEVICE, AND ELECTRONIC APPARATUS

(71) Applicant: SEIKO EPSON CORPORATION, Tokyo (JP)

(72) Inventors: Suguru Akagawa, Matsumoto (JP); Ryoichi Nozawa, Kamiina-gun (JP); Takefumi Fukagawa, Suwa-gun (JP)

(73) Assignee: SEIKO EPSON CORPORATION, Tokyo (JP)

( * ) Notice: Subject to any disclaimer, the term of this patent is extended or adjusted under 35 U.S.C. 154(b) by 0 days.

(21) Appl. No.: 16/742,014

(22) Filed: Jan. 14, 2020

(65) Prior Publication Data

US 2020/0227680 A1 Jul. 16, 2020

(30) Foreign Application Priority Data

Jan. 15, 2019 (JP) .............................. JP2019-004143

(51) Int. Cl.
*H01L 51/52* (2006.01)
*H01L 27/32* (2006.01)
*H01L 51/56* (2006.01)

(52) U.S. Cl.
CPC ........ *H01L 51/5253* (2013.01); *H01L 27/322* (2013.01); *H01L 51/56* (2013.01); *H01L 27/3258* (2013.01); *H01L 27/3276* (2013.01); *H01L 2227/323* (2013.01)

(58) Field of Classification Search
CPC .................................................. H01L 51/5253
See application file for complete search history.

(56) References Cited

U.S. PATENT DOCUMENTS

| | | | |
|---|---|---|---|
| 2008/0018244 A1* | 1/2008 | Anandan | H01L 51/5243 313/511 |
| 2010/0078665 A1* | 4/2010 | Koyama | H01L 51/5253 257/98 |
| 2015/0102376 A1* | 4/2015 | Toya | H01L 51/5246 257/98 |
| 2016/0126498 A1* | 5/2016 | Kim | H01L 51/5234 257/40 |
| 2017/0237033 A1* | 8/2017 | Koshihara | H01L 51/524 257/88 |

FOREIGN PATENT DOCUMENTS

| | | | |
|---|---|---|---|
| JP | 2018-073760 A | | 5/2018 |
| JP | 2018073760 A | * | 5/2018 |

* cited by examiner

*Primary Examiner* — Tuan A Hoang
(74) *Attorney, Agent, or Firm* — Oliff PLC

(57) ABSTRACT

An organic electroluminescence device includes a substrate, an organic electroluminescence element disposed on the substrate, a protecting portion configured to protect the organic electroluminescence element, and a resin portion mainly composed of a resin material. The protecting portion includes a first layer mainly composed of a silicon-based inorganic material containing nitrogen, a second layer mainly composed of silicon oxide or aluminum oxide, and a third layer mainly composed of a silicon-based inorganic material containing nitrogen, and the resin portion is disposed at a side surface of the second layer.

6 Claims, 15 Drawing Sheets

ORGANIC ELECTROLUMINESCENCE DEVICE, METHOD FOR MANUFACTURING ORGANIC ELECTROLUMINESCENCE DEVICE, AND ELECTRONIC APPARATUS

The present application is based on, and claims priority from JP Application Serial Number 2019-004143, filed Jan. 15, 2019, the disclosure of which is hereby incorporated by reference herein in its entirety.

BACKGROUND

1. Technical Field

The present disclosure relates to an organic electroluminescence device, a method for manufacturing an organic electroluminescence device, and an electronic apparatus.

2. Related Art

Organic electroluminescence (EL) devices including organic light-emitting diodes (OLEDs) are known. The organic EL device is used as, for example, an organic EL display configured to display an image.

JP-A-2018-73760 discloses an organic device including an organic light-emitting layer. The organic device includes the organic light-emitting layer and a first sealing layer disposed on the organic light-emitting layer. The first sealing layer is formed of a laminate of a silicon nitride film and an aluminum oxide film. Further, since resistance of the aluminum oxide film to water is lower than that of the silicon nitride film, the first sealing layer is covered with a second sealing layer formed of a silicon nitride film so as to block an entry of water into the aluminum oxide film.

In formation of the first sealing layer and the second sealing layer, a photolithography method is used. Thus, in order to form the first sealing layer and the second sealing layer, processing of forming a resist pattern, and peeling the resist pattern after etching is performed needs to be repeated for a plurality of times. Further, in order to form the second sealing layer formed of a silicon nitride film with high definition, a photoresist method may be used, and other methods are difficult to substitute. Thus, there is a problem in that, when the second sealing layer is formed of a silicon nitride film, a film formation process of the first sealing layer and the second sealing layer becomes complex.

SUMMARY

One aspect of an organic electroluminescence device in the present disclosure includes a substrate, an organic electroluminescence element disposed on the substrate, a protecting portion configured to protect the organic electroluminescence element, and a resin portion mainly composed of a resin material, where the protecting portion includes a first layer disposed on a side opposite to the substrate with respect to the organic electroluminescence element, and mainly composed of a silicon-based inorganic material containing nitrogen, a second layer disposed on a side opposite to the organic electroluminescence element with respect to the first layer, and mainly composed of silicon oxide or aluminum oxide, and a third layer disposed on a side opposite to the first layer with respect to the second layer, and mainly composed of a silicon-based inorganic material containing nitrogen, and the resin portion is disposed at a side surface of the second layer.

One aspect of a method for manufacturing an organic electroluminescence device in the present disclosure includes forming an organic electroluminescence element on a substrate, forming a protecting portion configured to protect the organic electroluminescence element, and forming a resin portion mainly composed of a resin material, where the formation of the protecting portion includes forming, on the organic electroluminescence element, a first layer mainly composed of a silicon-based inorganic material containing nitrogen, forming, on the first layer, a second layer mainly composed of silicon oxide or aluminum oxide, and forming, on the second layer, a third layer mainly composed of a silicon-based inorganic material containing nitrogen, and the formation of the resin portion includes forming, at a side surface of the second layer, the resin portion mainly composed of a resin material.

DESCRIPTION OF EXEMPLARY EMBODIMENTS

Figure 1:
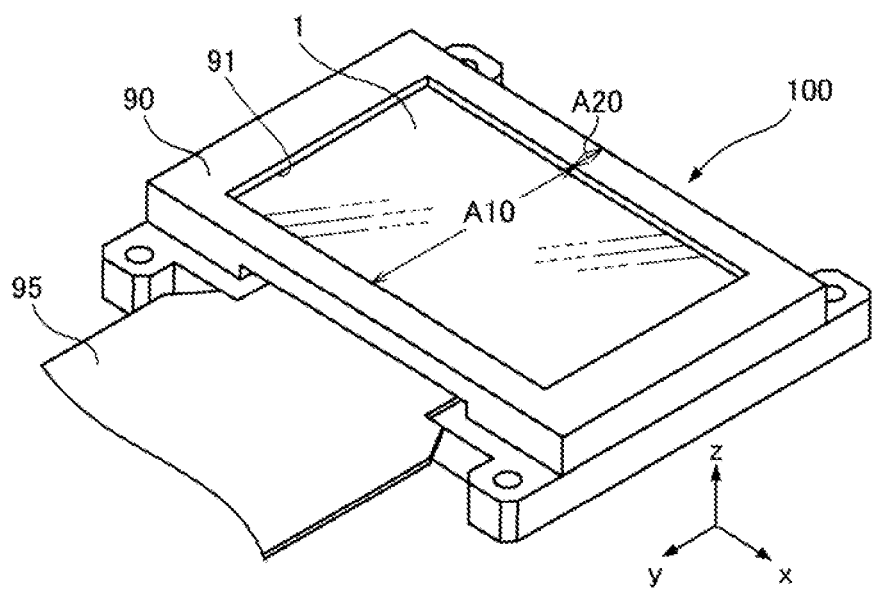
FIG. 1 is a perspective view illustrating an organic EL device according to a first embodiment.

Preferred embodiments of the present disclosure will be described below with reference to the accompanying drawings. Note that, in the drawings, dimensions and scales of sections are differed from actual dimensions and scales as appropriate, and some of the sections are schematically illustrated to make them easily recognizable. Further, the scope of the present disclosure is not limited to these embodiments unless otherwise stated to limit the present disclosure in the following descriptions.

1. Organic Electroluminescence (EL) Device and Method for Manufacturing Organic EL Device

1-1. First Embodiment

FIG. 1 is a perspective view illustrating a configuration of an organic EL device 100 according to a first embodiment. Note that, for convenience of explanation, the description will be made appropriately using an x-axis, a y-axis, and a z-axis orthogonal to each other illustrated in FIG. 1. A surface of a transmissive substrate 7 included in a display panel 1 described later is parallel to an x-y plane, and a lamination direction of a plurality of layers included in the display panel 1 described later is a z direction.

1-1A. Overall Configuration of Organic EL Device 100

The organic EL device 100 illustrated in FIG. 1 is an example of an "organic electroluminescence device", and is an organic EL display device configured to display a full color image. The organic EL device 100 is used as a micro display configured to display an image in a head-mounted display, for example. Note that the head-mounted display will be described later in detail.

The organic EL device 100 includes a case 90 including an opening 91, a display panel 1 provided in the case 90, and a flexible printed circuit (FPC) substrate 95 electrically coupled to the display panel 1. Note that, although not illustrated, the FPC substrate 95 is coupled to an upper circuit provided outside. Further, the organic EL device 100 includes a light-emitting region A10 in which an image is displayed, and a non-light-emitting region A20 surrounding the light-emitting region A10. Note that the light-emitting region A10 has a rectangular shape in plan view as illustrated in the drawings, but a planar shape of the light-emitting region A10 is not limited to this, and may be, for example, circular or the like. The plan view refers to viewing from a −z direction parallel to a thickness direction of the transmissive substrate 7 included in the display panel 1 described later.

Figure 2:
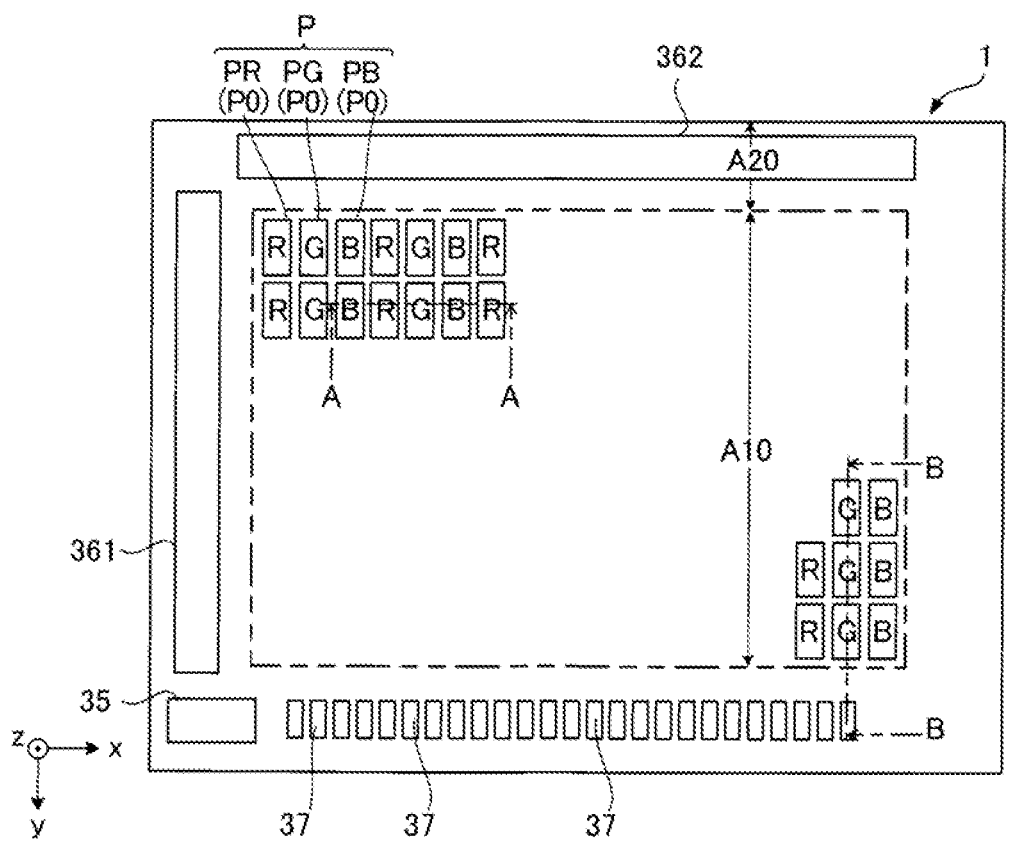
FIG. 2 is a schematic plan view illustrating a display panel according to the first embodiment.

FIG. 2 is a schematic plan view illustrating the display panel 1 according to the first embodiment. As illustrated in FIG. 2, a plurality of sub-pixels P0 are provided in matrix of M rows and N columns in the light-emitting region A10 of the display panel 1. Specifically, a plurality of sub-pixels PB corresponding to a blue wavelength region, a plurality of sub-pixels PG corresponding to a green wavelength region, and a plurality of sub-pixels PR corresponding to a red wavelength region are provided in the light-emitting region A10 of the display panel 1. Note that, in the present specification, when the sub-pixel PB, the sub-pixel PG, and the sub-pixel PR are not differentiated, they are expressed as the sub-pixel P0. The sub-pixels PB, the sub-pixels PG, and the sub-pixels PR are arranged in the same color along a y direction, and are arranged repeatedly in the order of red, green, and blue along an x direction. Note that the arrangement of the sub-pixels PB, the sub-pixels PG, and the sub-pixels PR is not limited to this, and any arrangement may be used. Further, one pixel P is constituted of one sub-pixel PB, one sub-pixel PG, and one sub-pixel PR.

Further, a control circuit 35, a scanning line drive circuit 361, and a data line drive circuit 362 are provided in the non-light-emitting region A20 of the display panel 1. Further, a plurality of terminals 37 coupled to the FPC substrate 95 are provided in the non-light-emitting region A20 of the display panel 1. Further, the display panel 1 is coupled to a power supply circuit (not illustrated).

Note that the organic EL device 100 may have a configuration in which the case 90 and the FPC substrate 95 are omitted.

1-1B. Electrical Configuration of Display Panel 1

Figure 3:
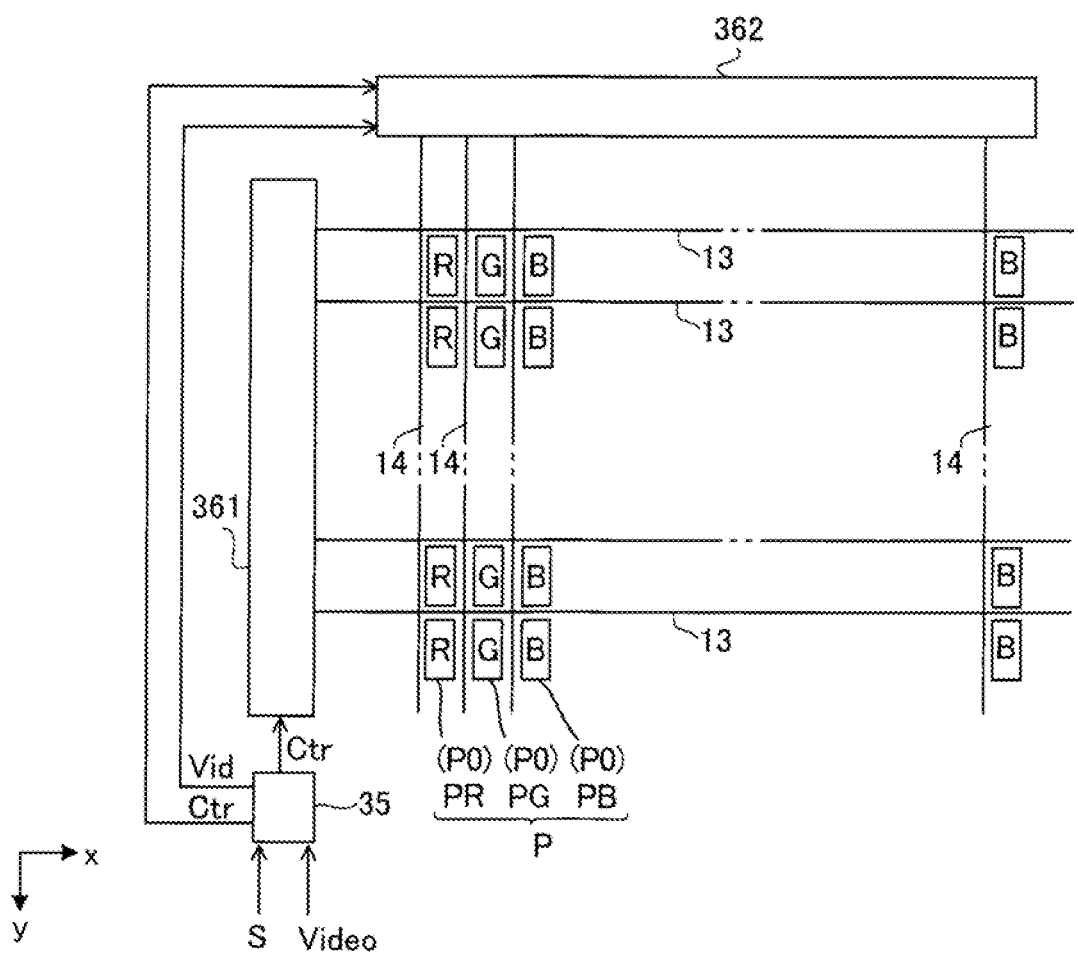
FIG. 3 is a block diagram illustrating an electrical configuration of the display panel according to the first embodiment.

FIG. 3 is a block diagram illustrating an electrical configuration of the display panel 1 according to the first embodiment. As illustrated in FIG. 3, the display panel 1 includes M scanning lines 13 extending along the x direction, and N data lines 14 intersecting the scanning lines 13 and extending along the y direction. Note that M and N are natural numbers. Further, the plurality of sub-pixels P0 are constituted so as to correspond to intersections between the M scanning lines 13 and the N data lines 14.

The control circuit 35 is configured to control display of an image. Image data Video, which is digital, is supplied from the upper circuit (not illustrated) synchronously with a synchronization signal S to the control circuit 35. The control circuit 35 generates a control signal Ctr based on the synchronization signal S, and supplies the control signal Ctr to the scanning line drive circuit 361 and the data line drive circuit 362. Further, the control circuit 35 generates an image signal Vid, which is analog, based on the image data Video, and supplies the image signal Vid to the data line drive circuit 362. Note that the image data Video described above is data specifying a gradation level of the sub-pixels P0 by, for example, eight bits. The synchronization signal S is a signal including a vertical synchronization signal, a horizontal synchronization signal, and a dot clock signal.

The scanning line drive circuit 361 is coupled to the M scanning lines 13. Based on the control signal Ctr, the scanning line drive circuit 361 generates a scanning signal for sequentially selecting the M scanning lines 13 one by one within one frame period, and outputs the generated scanning signal to the M scanning lines 13. Further, the data line drive circuit 362 is coupled to the N data lines 14. Based on the image signal Vid and the control signal Ctr, the data line drive circuit 362 generates a data signal according to gradation to be displayed, and outputs the generated data signal to the N data lines 14.

Note that the scanning line drive circuit 361 and the data line drive circuit 362 may be integrated as one drive circuit. Further, the control circuit 35, the scanning line drive circuit 361, and the data line drive circuit 362 may each be divided into a plurality of circuits. Further, as illustrated in the drawings, the control circuit 35 is provided on the display panel 1, but the control circuit 35 may be provided on the FPC substrate 95 illustrated in FIG. 1, for example.

Figure 4:
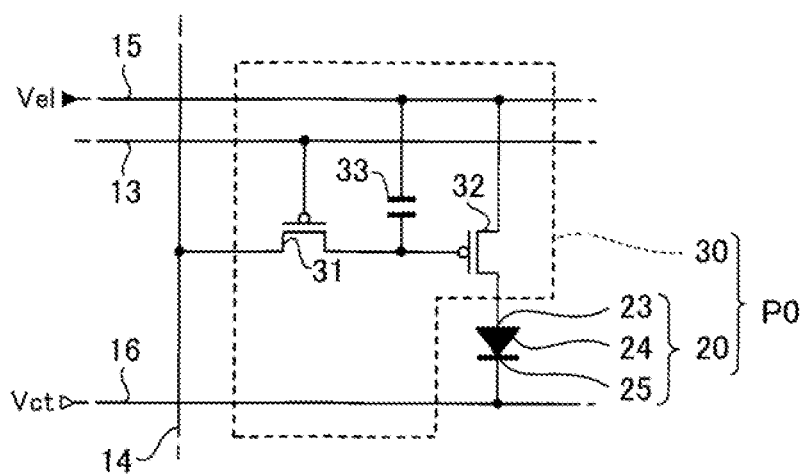
FIG. 4 is an equivalent circuit diagram of a sub-pixel according to the first embodiment.

FIG. 4 is an equivalent circuit diagram of the sub-pixel P0 according to the first embodiment. As illustrated in FIG. 4, the sub-pixel P0 is provided with a light-emitting element 20 and a pixel circuit 30 that controls driving of the light-emitting element 20.

The light-emitting element 20 is an example of an "organic electroluminescence element", and is constituted of an organic light-emitting diode (OLED). The light-emitting element 20 includes an anode 23, an organic layer 24, and a cathode 25. The anode 23 supplies holes to the organic layer 24. The cathode 25 supplies electrons to the organic layer 24. In the light-emitting element 20, the holes supplied from the anode 23 and the electrons supplied from the cathode 25 are recombined in the organic layer 24, and the organic layer 24 emits white light. Note that a power supplying line 16 is electrically coupled to the cathode 25. A power supply potential Vct on a low potential side is supplied from the power supply circuit (not illustrated) to the power supplying line 16.

The pixel circuit 30 includes a switching transistor 31, a driving transistor 32, and a retention capacitor 33. A gate of the switching transistor 31 is electrically coupled to the scanning line 13. Further, one of a source and a drain of the switching transistor 31 is electrically coupled to the data line 14, and the other is electrically coupled to a gate of the driving transistor 32. Further, one of a source and a drain of the driving transistor 32 is electrically coupled to the power supplying line 15, and the other is electrically coupled to the anode 23. Note that a power supply potential Vel on a high potential side is supplied from the power supply circuit (not illustrated) to the power supplying line 15. Further, one of electrodes of the retention capacitor 33 is coupled to the gate of the driving transistor 32, and the other electrode is coupled to the power supplying line 15.

In the display panel 1 having the electrical configuration, when the scanning line 13 is selected by activating the scanning signal by the scanning line drive circuit 361, the switching transistor 31 provided in the selected sub-pixel P0 is turned on. Then, the data signal is supplied from the data line 14 to the driving transistor 32 corresponding to the selected scanning line 13. The driving transistor 32 supplies a current corresponding to a potential of the supplied data signal, that is, a current corresponding to a potential difference between the gate and the source, to the light-emitting element 20. Then, the light-emitting element 20 emits light at a luminance corresponding to a magnitude of the current supplied from the driving transistor 32. Further, when the scanning line drive circuit 361 releases the selection of the scanning line 13 and the switching transistor 31 is turned off, the potential of the gate of the driving transistor 32 is held by the retention capacitor 33. Thus, the light-emitting element 20 can emit light even after the switching transistor 31 is turned off.

The electrical configuration of the display panel 1 is described above. Note that the configuration of the pixel circuit 30 described above is not limited to the illustrated configuration. For example, a transistor that controls conduction between the anode 23 and the driving transistor 32 may be further provided.

1-1C. Configuration of Display Panel 1

Figure 5:
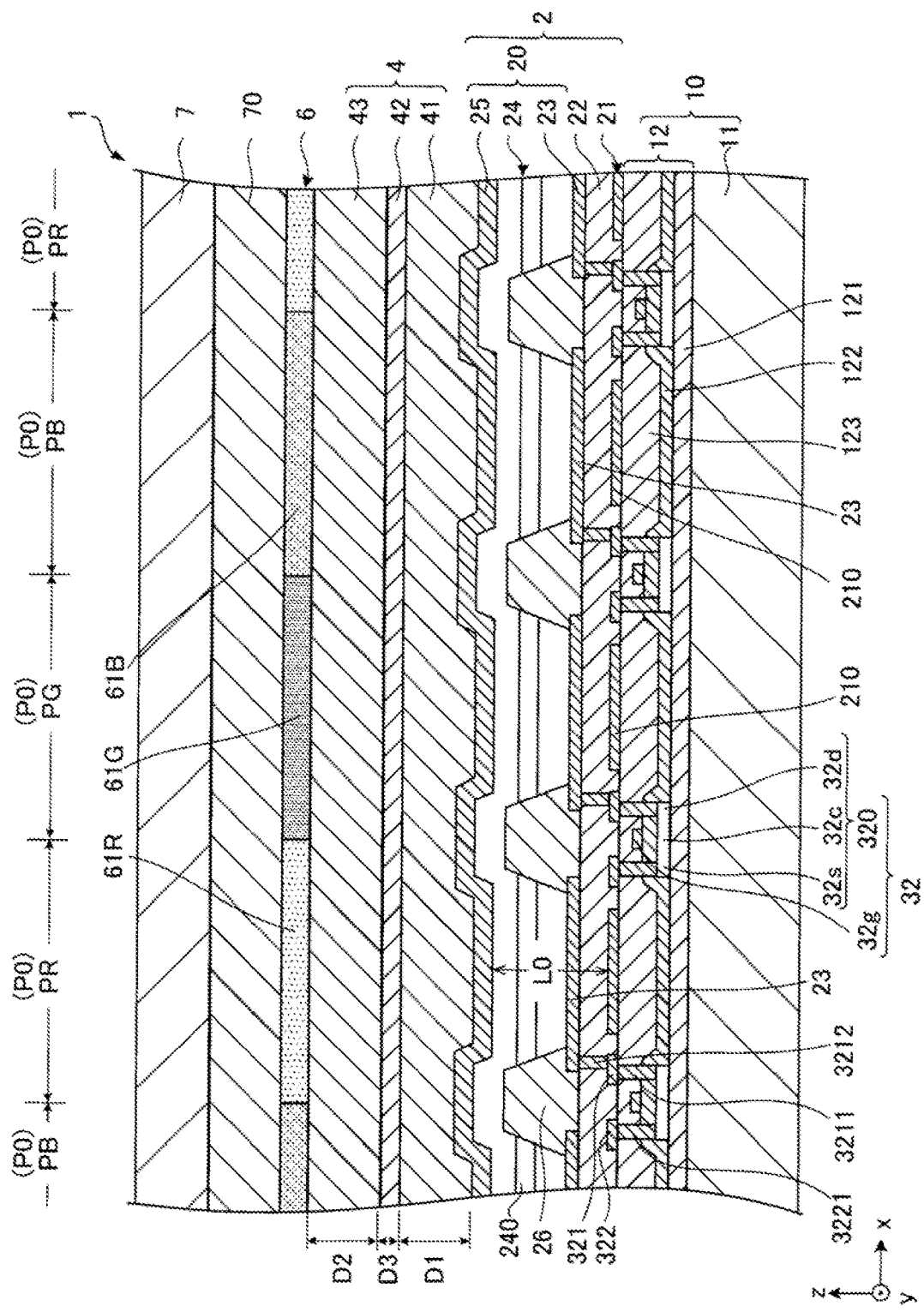
FIG. 5 is a partial cross-sectional view of the display panel according to the first embodiment.

FIG. 5 is a partial cross-sectional view of the display panel 1 according to the first embodiment, and is a cross-sectional view of the display panel 1 taken along an A-A line in FIG. 2. In the following description, "translucency" refers to transparency to visible light, and means that a transmittance of visible light may be greater than or equal to 50%. Further, "light reflectivity" refers to reflectivity to visible light, and means that a reflectance of visible light may be greater than or equal to 50%.

The display panel 1 illustrated in FIG. 5 includes a substrate 10, a light-emitting portion 2 including the plurality of light-emitting elements 20, a protecting portion 4, a color filter layer 6, an adhesive layer 70, and the transmissive substrate 7. The light-emitting portion 2, the protecting portion 4, the color filter layer 6, and the adhesive layer 70 are laminated in this order from the substrate 10 toward the transmissive substrate 7. The display panel 1 is a top-emission type, and light generated from the light-emitting element 20 is transmitted through the transmissive substrate 7 and emitted.

Substrate 10

The substrate 10 includes, for example, a substrate main body 11 and a wiring layer 12. The substrate main body 11 is made of silicon, glass, resin, ceramic, or the like, for example. Further, the display panel 1 is a top-emission type, and thus the substrate main body 11 may or may not have translucency.

The wiring layer 12 includes various wiring lines and the like and a plurality of insulating films 121, 122, and 123. Various wiring lines and the like include the pixel circuit 30 including the switching transistor 31, the driving transistor 32, and the retention capacitor 33 described above, the scanning line 13, the data line 14, the power supplying line 15, and the power supplying line 16. Note that FIG. 5 does not illustrate all of the various wiring lines.

The insulating film 121 of the wiring layer 12 is disposed on the substrate main body 11. A semiconductor layer 320 included in the driving transistor 32 is disposed on the insulating film 121. The semiconductor layer 320 has a channel $32c$, a drain $32d$, and a source $32s$. Note that, when the substrate main body 11 is silicon, ions may be injected into the substrate main body 11 to form the semiconductor layer 320. Further, the insulating film 122 is disposed on the insulating film 121 so as to cover the semiconductor layer 320. A gate electrode $32g$ of the driving transistor 32 is disposed on the insulating film 122. The gate electrode $32g$ overlaps the channel $32c$ in plan view. The insulating film 123 is disposed on the insulating film 122 so as to cover the gate electrode $32g$. Relay electrodes 321 and 322 are disposed on the insulating film 123. The relay electrode 321 is electrically coupled to the drain $32d$ via a through electrode 3211 disposed in a contact hole that penetrates the insulating film 122. On the other hand, the relay electrode 322 is electrically coupled to the source $32s$ via the through electrode 3221 disposed in the contact hole that penetrates the insulating film 122. Note that, although not illustrated in FIG. 5, the relay electrode 322 is coupled to the power supplying line 15.

Examples of a constituent material of the insulating films 121, 122, and 123 include silicon-based inorganic materials such as silicon oxide, silicon nitride, and silicon oxynitride. Further, examples of a constituent material of various wiring lines and the like include metal, metal silicide, and a metal compound, for example.

Light-Emitting Portion 2

The light-emitting portion 2 that resonates light in a predetermined wavelength region is disposed on a surface of the substrate 10 on the +z side. The light-emitting portion 2 includes a reflection layer 21, a resonance adjustment layer 22, and the plurality of light-emitting elements 20. As described above, the plurality of light-emitting elements 20 include the plurality of anodes 23, the organic layer 24, and the cathode 25.

The reflection layer 21 is disposed on the insulating film 123 of the substrate 10. The reflection layer 21 has light reflectivity, and reflects light generated from the organic layer 24 toward the organic layer 24 side. The reflection layer 21 is, for example, a laminate in which a layer containing titanium (Ti) and a layer containing an Al—Cu alloy are laminated in this order on the insulating film 123. Further, as illustrated in the drawings, the reflection layer 21 includes a plurality of reflection portions 210 arranged in matrix. The reflection portion 210 is provided for each sub-pixel P0. Note that the reflection layer 21 is not limited to the illustrated configuration as long as the reflection layer 21 has light reflectivity.

The resonance adjustment layer 22 is disposed on the insulating film 123 so as to cover the reflection layer 21. The resonance adjustment layer 22 is a layer that adjusts an optical distance L0 being an optical distance between the reflection layer 21 and the cathode 25.

As illustrated in the drawing, a thickness of the resonance adjustment layer 22 is equal in the sub-pixels PB, PG, and PR, but actually varies for each light emission color. Further, the optical distance L0 of the sub-pixel P0 varies for each light emission color. The optical distance L0 in the sub-pixel PB is set so as to correspond to light in a blue wavelength region. The optical distance L0 in the sub-pixel PG is set so as to correspond to light in a green wavelength region. The optical distance L0 in the sub-pixel PR is set so as to correspond to light in a red wavelength region. Therefore, in fact, a film thickness of the resonance adjustment layer 22 in the sub-pixel PB is the thinnest, and a film thickness of the resonance adjustment layer 22 in the sub-pixel PR is the thickest. Note that the optical distance L0 may be adjusted by adjusting a film thickness of the anode 23 instead of a film thickness of the resonance adjustment layer 22. Further, the optical distance L0 may be adjusted by adjusting both of a film thickness of the resonance adjustment layer 22 and a film thickness of the anode 23.

Further, examples of a constituent material of the resonance adjustment layer 22 include inorganic materials having translucency and insulating properties. Specifically, examples thereof include silicon oxide, silicon nitride, and the like.

The plurality of anodes 23 and a partition 26 surrounding each of the anodes 23 in plan view are disposed on a surface of the resonance adjustment layer 22 on the +z side. The anode 23 is provided for each sub-pixel P0, and the anodes 23 are insulated from each other by the partition 26. Note that the partition 26 has a lattice shape in plan view, for example. Further, the anode 23 is electrically coupled to the relay electrode 321 via a through electrode 3212 disposed in a contact hole that penetrates the resonance adjustment layer 22.

Further, the constituent material of the anode 23 is a transparent conductive material such as Indium Tin Oxide (ITO) or Indium Zinc Oxide (IZO), for example. Further, the constituent material of the partition 26 is an insulating material, and specifically, is an inorganic material such as an acrylic-based photosensitive resin or silicon oxide.

The organic layer 24 is disposed on a surface of the anode 23 on the +z side. The organic layer 24 includes at least a light-emitting layer 240 containing a light-emitting material that emits light by supplying current. In the present embodiment, the light-emitting layer 240 includes lamination of a layer containing a blue light-emitting material, a layer containing a green light-emitting material, and a layer containing a red light-emitting material. Blue light is generated from the layer containing the blue light-emitting material, green light is generated from the layer containing the green light-emitting material, and red light is generated from the layer containing the red light-emitting material. Therefore, it can be said that white light is generated from the light-emitting layer 240. Further, in addition to the light-emitting layer 240, a hole injection layer (HIL), a hole transportation layer (HTL), an electron injection layer (EIL), and an electron transportation layer (ETL) are provided in the present embodiment. In the organic layer 24, holes injected from the hole injection layer and electrons transported from the electron transportation layer are recombined in the light-emitting layer 240. Note that any configuration may be used for the configuration of the organic layer 24, and any of the layers described above may be omitted from the organic layer 24, or any layer may be further added.

The cathode 25 is disposed on a surface of the organic layer 24 on the +z side. The cathode 25 has translucency and light reflectivity. The cathode 25 is a common electrode formed continuously across the plurality of sub-pixels P0. The cathode 25 is formed by, for example, magnesium and silver, or an alloy including these materials as main components, and the like.

In the light-emitting portion 2, light in a predetermined wavelength region of light generated from the organic layer 24 is caused to resonate between the reflection layer 21 and the cathode 25. When a peak wavelength of a spectrum of the light in the predetermined wavelength region is represented by λ0, the following relationship [1] holds true. Φ (radian) represents a sum total of phase shifts that occur in transmitting and reflecting within the light-emitting portion 2.

$$\{(2 \times L0)/\lambda 0 + \Phi\}/(2\pi) = m0 \ (m0 \text{ is an integer}) \quad [1]$$

The optical distance L0 is set such that a peak wavelength of light in a wavelength region to be extracted is λ0. Then, by setting a film thickness of each of the resonance adjustment layer 22 and the anode 23 in accordance with the optical distance L0, the light in the predetermined wavelength region to be extracted is caused to resonate and enhanced. The light in the predetermined wavelength region is enhanced by adjusting the optical distance L0 in accordance with the light in the wavelength region to be extracted, and the light can be increased in intensity and a spectrum of the light can be narrowed.

Protecting Portion 4

The protecting portion 4 is disposed on the cathode 25, and seals the light-emitting portion 2. The organic layer 24 can be protected from moisture, oxygen, or the like in the atmosphere by providing the protecting portion 4. In other words, the protecting portion 4 has gas barrier properties. Thus, reliability of the display panel 1 can be increased as compared to a case in which the protecting portion 4 is not provided. Further, the protecting portion 4 has translucency.

The protecting portion 4 includes a first layer 41 disposed on the cathode 25, a second layer 42 disposed on the first layer 41, and a third layer 43 disposed on the second layer.

The first layer 41 is mainly composed of a silicon-based inorganic material containing nitrogen. The terms "mainly composed" mean that greater than or equal to 70% of a constituent material of the first layer 41 is a silicon-based inorganic material containing nitrogen. The gas barrier properties of the first layer 41 can be increased by forming the first layer 41 mainly composed of a silicon-based inorganic material containing nitrogen as compared to a case in which the first layer 41 is mainly composed of silicon oxide. Examples of the silicon-based inorganic material containing nitrogen include silicon oxynitride or silicon nitride. The gas barrier properties of the first layer 41 can be particularly increased by using silicon nitride among others.

Further, the first layer 41 may be formed by using a chemical vapor deposition (CVD) method using plasma. The first layer 41 having a sufficiently thin thickness can be easily formed by using the CVD method. Further, a film formation speed can be increased by using the CVD method as compared to a case in which an atomic layer deposition (ALD) method is used. Further, a film can be formed at a lower temperature by using plasma in the CVD method as compared to a case in which the plasma is not used, and stress of the first layer 41 can be reduced by adjusting the amount of gas.

A thickness D1 of the first layer 41 is preferably greater than or equal to 50 nm and less than or equal to 1000 nm, is more preferably greater than or equal to 70 nm and less than or equal to 600 nm, and is even more preferably greater than or equal to 100 nm and less than or equal to 400 nm. When the thickness is within such a range, the gas barrier properties of the first layer 41 can be particularly increased, and a risk of cracking due to the thickness of the first layer 41 becoming excessively thick can be reduced. Note that the thickness D1 is an average thickness of the first layer 41.

The second layer 42 is disposed on the first layer 41. The second layer 42 is mainly composed of silicon oxide such as silicon dioxide or aluminum oxide. The terms "mainly composed" mean that greater than or equal to 70% of a constituent material of the second layer 42 is silicon oxide or aluminum oxide. Even when a defect such as a pinhole occurs in the first layer 41 during manufacturing, the defect can be complemented by providing the second layer 42. Thus, it is possible to particularly effectively suppress transmission of moisture and the like in the atmosphere to the organic layer 24 with, as a path, a defect such as a pinhole that may occur in the first layer 41. Further, the second layer 42 may be formed by using the ALD method using plasma. The function of complementing a defect in the first layer 41 can be particularly suitably exhibited by forming the second layer 42 by using the ALD method. Further, a film can be formed at a lower temperature by using plasma in the ALD method as compared to a case in which the plasma is not used.

Further, resistance of the second layer 42 to water can be increased by forming the second layer 42 mainly composed of silicon oxide as compared to a case in which the second layer 42 is mainly composed of alumina. Thus, even when washing treatment, wet etching, or the like is performed during manufacturing of the display panel 1, the second layer 42 dissolving in water can be further suppressed. As a result, the second layer 42 dissolving in water and a decreasing sealing function of the protecting portion 4 can be further suppressed. Further, the second layer 42 may be mainly composed of silicon oxide because translucency is higher than that when the second layer 42 is mainly composed of silicon nitride.

A thickness D2 of the second layer 42 is preferably greater than or equal to 10 nm and less than or equal to 100 nm, is more preferably greater than or equal to 15 nm and less than or equal to 90 nm, and is even more preferably greater than or equal to 20 nm and less than or equal to 60 nm. When the thickness is within such a range, the function of complementing a defect in the first layer 41 can be significantly exhibited, and formation time of the second layer 42 becoming excessively long can also be suppressed. Note that the thickness D2 is an average thickness of the second layer 42.

The third layer 43 is disposed on the second layer 42. The third layer 43 is mainly composed of a silicon-based inorganic material containing nitrogen. The terms "mainly composed" mean that greater than or equal to 70% of a constituent material of the third layer 43 is a silicon-based inorganic material containing nitrogen. By providing the third layer 43 in addition to the first layer 41 and the second layer 42, the gas barrier properties of the protecting portion 4 can be increased further than those when the third layer 43 is not provided. Particularly, the gas barrier properties of the first layer 41 can be increased by using silicon nitride. Further, it is easy to optimize a distance between the color filter layer 6 and the light-emitting element 20. Further, the third layer 43 may be formed by using the CVD method using plasma, similarly to the first layer 41. The third layer 43 having a sufficiently thin thickness can be easily formed by using the CVD method.

The third layer 43 is formed by using the CVD method using plasma, similarly to the first layer 41. A thickness D3 of the third layer 43 is preferably greater than or equal to 200 nm and less than or equal to 1000 nm, is more preferably greater than or equal to 250 nm and less than or equal to 900 nm, and is even more preferably greater than or equal to 300 nm and less than or equal to 800 nm. When the thickness is within such a range, the gas barrier properties of the third layer 43 can be particularly increased, and a risk of cracking due to the thickness D3 of the third layer 43 becoming excessively thick can be reduced. Note that the thickness D3 is an average thickness of the third layer 43.

Further, the protecting portion 4 is formed of a layer mainly composed of silicon nitride or silicon oxide, and does not include a layer mainly composed of an organic material. Thus, the protecting portion 4 having a sufficiently thin thickness can be achieved as compared to a case in which the protecting portion 4 includes a layer mainly composed of an organic material. Further, mechanical shock or the like applied to the light-emitting portion 2 from the outside can be mitigated. Furthermore, when a layer mainly composed of an organic material is provided, there is a risk that a component of the protecting portion 4 enters the organic layer 24. However, such a risk can be prevented by forming the protecting portion 4 mainly composed of silicon nitride or silicon oxide.

Further, the first layer 41 and the third layer 43 may be made of only a silicon-based inorganic material containing nitrogen, and the second layer 42 may be made of only silicon oxide. However, another material may be included to the extent that the function of each layer is not reduced.

Color Filter Layer 6

The color filter layer 6 is disposed on the protecting portion 4. The color filter layer 6 corresponds to light in a predetermined wavelength region, and selectively transmits the light in the predetermined wavelength region. The color filter layer 6 includes a colored layer 61B corresponding to the sub-pixel PB, a colored layer 61G corresponding to the sub-pixel PG, and a colored layer 61R corresponding to the sub-pixel PR. In the light-emitting region A10, the colored layer 61B, the colored layer 61G, and the colored layer 61R are aligned along the x-y plane.

The color filter layer 6 is formed of a resin material including a colored material of each color. Specifically, for example, the color filter layer 6 may be formed of an acrylic photosensitive resin material including a color material. Note that the display panel 1 may have a configuration in which the color filter layer 6 is omitted. However, color purity of light emitted from the display panel 1 can be increased by providing the color filter layer 6 in the display panel 1 as compared to a case in which the color filter layer 6 is not provided.

Adhesive Layer 70

The adhesive layer 70 having translucency is disposed on the color filter layer 6. The adhesive layer 70 adheres the transmissive substrate 7 to the color filter layer 6. Note that when the color filter layer 6 is omitted, the transparent substrate 7 adheres to the protecting portion 4. The adhesive layer 70 may be formed of any material as long as the material allows the transparent substrate 7 to adhere to the color filter layer 6 and has translucency. The adhesive layer 70 is formed of, for example, a transparent resin material such as epoxy resin and acrylic resin. The manufacturing time of the adhesive layer 70 can be shortened by particularly using a photosensitive resin as compared to a case in which a thermosetting resin is used. Further, damage caused by heat of the light-emitting element 20 can be reduced.

Transmissive Substrate 7

The transmissive substrate 7 is disposed on the color filter layer 6 via an adhesive layer 70. The transmissive substrate 7 is a cover that protects the color filter layer 6, the light-emitting element 20, and the like. The transmissive substrate 7 has translucency and is formed of, for example, a glass substrate or a quartz substrate.

Figure 6:
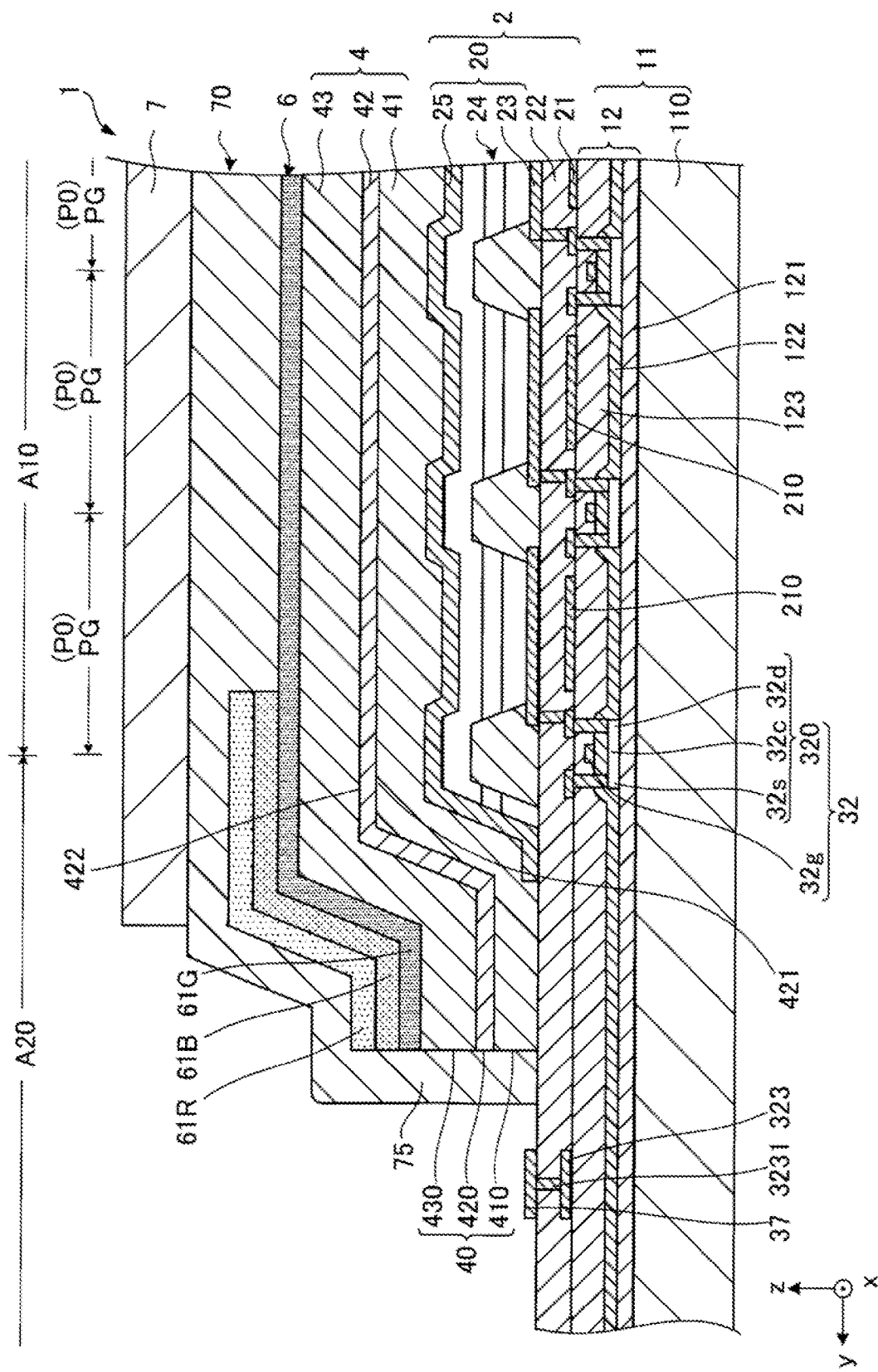
FIG. 6 is a partial cross-sectional view of the display panel according to the first embodiment.
Figure 7:
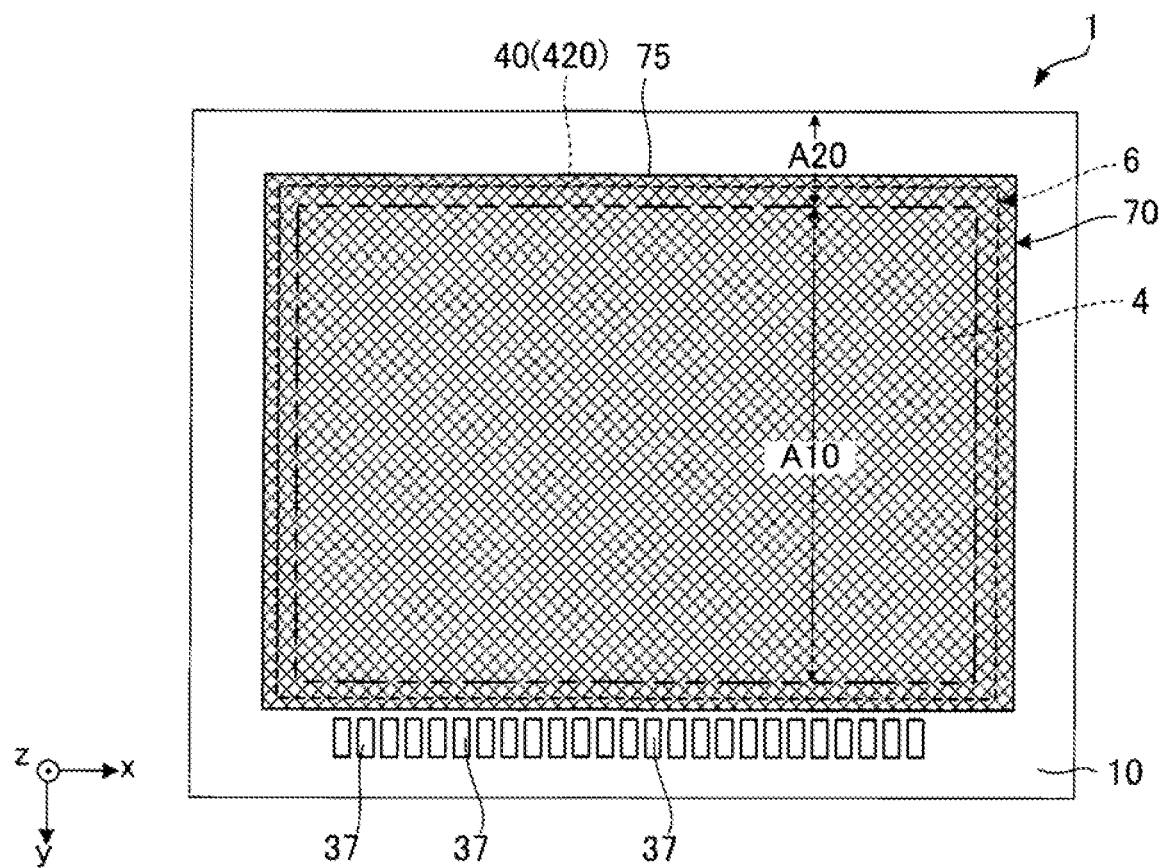
FIG. 7 is a plan view of the display panel according to the first embodiment.

Next, the terminal 37 of the display panel 1 and a surrounding structure thereof will be described with reference to FIGS. 6 and 7. FIG. 6 is a partial cross-sectional view of the display panel 1 according to the first embodiment, and is a cross-sectional view of the display panel 1 taken along a B-B line in FIG. 2. FIG. 7 is a plan view of the display panel according to the first embodiment. Note that the transmissive substrate 7 is not illustrated in FIG. 7. Further, in FIG. 7, shading is provided to the adhesive layer 70 in order to facilitate understanding of the arrangement of the adhesive layer 70.

As illustrated in FIG. 6, the terminal 37 is disposed on a surface of the resonance adjustment layer 22 on the +z side. The terminal 37 is electrically coupled to a relay electrode 323 via a through electrode 3231 disposed in a contact hole that penetrates the resonance adjustment layer 22. Although not illustrated in detail, the relay electrode 323 is electrically coupled to various wiring lines and the like provided in the wiring layer 12.

A portion of the color filter layer 6 located in the non-light-emitting region A20 is a laminate in which the colored layer 61G, the colored layer 61B, and the colored layer 61R are laminated in this order from the protecting portion 4 side. The portion of the color filter layer 6 is provided to prevent reflected light and prevent an effect of stray light. On the other hand, a portion of the color filter layer 6 located in the light-emitting region A10 functions as a color filter that transmits light having a predetermined wavelength, as described above.

The protecting portion 4 is disposed so as not to overlap the plurality of terminals 37 in plan view. Similarly, the color filter layer 6 is disposed so as not to overlap the plurality of terminals 37 in plan view. Further, the transmissive substrate 7 is disposed so as not to overlap the plurality of terminals 37 in plan view. Note that the transmissive substrate 7 is disposed in a region corresponding to the light-emitting region A10 in plan view.

The adhesive layer 70 covers the color filter layer 6 and the protecting portion 4. As illustrated in FIG. 7, the adhesive layer 70 is disposed in a range wider than the color filter layer 6 and the protecting portion 4 in plan view, and wraps the color filter layer 6 and the protecting portion 4. Note that the protecting portion 4 overlaps the color filter layer 6 in plan view. Further, as illustrated in FIG. 6, the adhesive layer 70 is in contact with a surface of the color filter layer 6 on the +z-axis side. Further, the adhesive layer 70 is in contact with an outer circumferential surface 420 of the second layer 42. The outer circumferential surface 420 is an example of a "side surface" of the second layer 42, and is a surface that connects a first main surface 421 of the second layer 42 on the −z-axis side and a second main surface 422 on the +z-axis side. Furthermore, in the present embodiment, the adhesive layer 70 is in contact with an outer circumferential surface 410 of the first layer 41 and an outer circumferential surface 430 of the third layer 43. In other words, in the present embodiment, the adhesive layer 70 is in contact with an outer circumferential surface 40 of the protecting portion 4. A portion of the adhesive layer 70 being in contact with the outer circumferential surface 40 of the protecting portion 4 constitutes a second protecting portion 75. In other words, the adhesive layer 70 includes the second protecting portion 75.

The second protecting portion 75 is an example of a "resin portion", and is mainly composed of a resin material. By including the second protecting portion 75, the outer circumferential surface 40 of the protecting portion 4 can be prevented from being exposed, and the protecting portion 4 can be protected. The light-emitting element 20 can be covered with the protecting portion 4 and the color filter layer 6 by including the second protecting portion 75. Thus, moisture, oxygen, or the like in the atmosphere can be prevented from entering the light-emitting element 20 as compared to a case in which the second protecting portion 75 is not included.

The display panel 1 having the configuration described above includes the substrate 10, the light-emitting element 20 that is disposed on the substrate 10 and serves as an "organic electroluminescence element", the protecting portion 4 that protects the light-emitting element 20, and the second protecting portion 75 that is mainly composed of a resin material and serves as a "resin portion". The protecting portion 4 is disposed on a side opposite to the substrate 10 with respect to the light-emitting element 20, and includes the first layer 41 mainly composed of a silicon-based inorganic material containing nitrogen, the second layer 42 disposed on a side opposite to the light-emitting element 20 with respect to the first layer 41 and mainly composed of silicon oxide or aluminum oxide, and the third layer 43 disposed on a side opposite to the first layer 41 with respect to the second layer 42 and mainly composed of a silicon-based inorganic material containing nitrogen. Then, the second protecting portion 75 is disposed on the outer circumferential surface 420 as an example of the "side surface" of the second layer 42.

The display panel 1 having excellent sealing performance and a sufficiently thin thickness can be provided by providing the protecting portion 4 including the first layer 41, the second layer 42, and the third layer 43. Further, the second protecting portion 75 can be formed on the outer circumferential surface 420 of the second layer 42 without using a photolithography method by forming the second protecting portion 75 mainly composed of a resin material, and thus the number of manufacturing steps of the display panel 1 can be reduced. Note that a method for manufacturing the second protecting portion 75 will be described later. Further, since the second layer 42 is less resistant to water than the first layer 41 and the third layer 43 containing silicon nitride, the second layer 42 being in contact with water during manufacturing of the display panel 1 can be suppressed or prevented by protecting the second layer 42 with the second protecting portion 75. Thus, a reduction in sealing performance of the protecting portion 4 can be suppressed. As a result, the display panel 1 having excellent quality reliability can be provided. Further, when the second layer 42 is mainly composed of aluminum oxide, protecting the second layer 42 with the second protecting portion 75 is particularly effective since resistance of the second layer 42 to water is particularly low. Further, resistance of the second layer 42 to water can be increased by forming the second layer 42 mainly composed of silicon oxide as compared to a case in which the second layer 42 is mainly composed of aluminum oxide.

In the present embodiment, the second protecting portion 75 is also disposed on the outer circumferential surface 410 of the first layer 41 and on the outer circumferential surface 430 of the third layer 43 in addition to being disposed on the outer circumferential surface 420 of the second layer 42. The protecting portion 4 can be more suitably protected by disposing the second protecting portion 75 on the outer circumferential surface 40 of the protecting portion 4. Thus, the light-emitting element 20 protected by the protecting portion 4 can be more suitably protected.

Note that the reflection layer 21 and the resonance adjusting layer 22 are disposed between the substrate 10 and the light-emitting element 20, but may be regarded as a part of the substrate 10. Further, any layer may be disposed between the substrate 10 and the light-emitting element 20, between the light-emitting element 20 and the first layer 41, between the first layer 41 and the second layer 42, between the second layer 42 and the third layer 43, and between the second protecting portion 75 and the outer circumferential surface 420 of the second layer 42 to the extent that the function of each portion is not impaired. The same also applies between other elements of the display panel 1. However, an arbitrary layer is not disposed between the first layer 41 and the second layer 42, and the first layer 41 and the second layer 42 may be particularly in contact with each other. In this way, the sealing performance of the first layer 41 can be particularly effectively exhibited, and the function of complementing a defect in the first layer 41 by the second layer 42 can also be particularly effectively exhibited. Similarly, an arbitrary layer is not disposed between the second 42 layer and the third layer 43, and the second 42 and third layer 43 may be particularly in contact with each other. In this way, the sealing performance of the third layer 43 can be particularly effectively exhibited.

Further, as described above, the display panel 1 includes the transmissive substrate 7 that is disposed on a side opposite to the light-emitting element 20 with respect to the protecting portion 4 and has translucency, and the adhesive layer 70 that is disposed between the protecting portion 4 and the transmissive substrate 7 and includes an adhesive. Then, the second protecting portion 75 is a part of the adhesive layer 70. Thus, the second protecting portion 75 is formed by forming the adhesive layer 70. Accordingly, the number of manufacturing steps of the display panel 1 can be reduced as compared to a case in which the second protecting portion 75 and the adhesive layer 70 are formed separately.

Note that the second protecting portion 75 may be disposed on at least the outer circumferential surface 420 of the second layer 42, and may not be disposed on the first layer 41 and the third layer 43.

1-1D. Method for Manufacturing Organic EL Device 100

Figure 8:
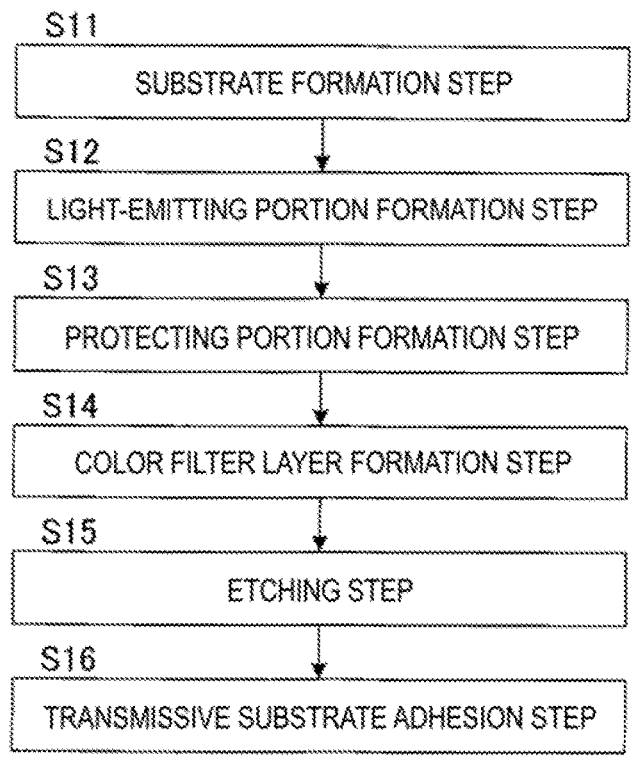
FIG. 8 is a flowchart illustrating a method for manufacturing the display panel according to the first embodiment.

Next, a method for manufacturing the display panel 1 included in the organic EL device 100 will be described. FIG. 8 is a flowchart illustrating the method for manufacturing the display panel 1 according to the first embodiment. As illustrated in FIG. 8, the method for manufacturing the display panel 1 includes a substrate formation step S11, a light-emitting portion formation step S12, a protecting portion formation step S13, a color filter layer formation step S14, an etching step S15, and a transmissive substrate adhesion step S16. The display panel 1 is manufactured by sequentially performing each of the steps.

Substrate Formation Step S11

Figure 9:
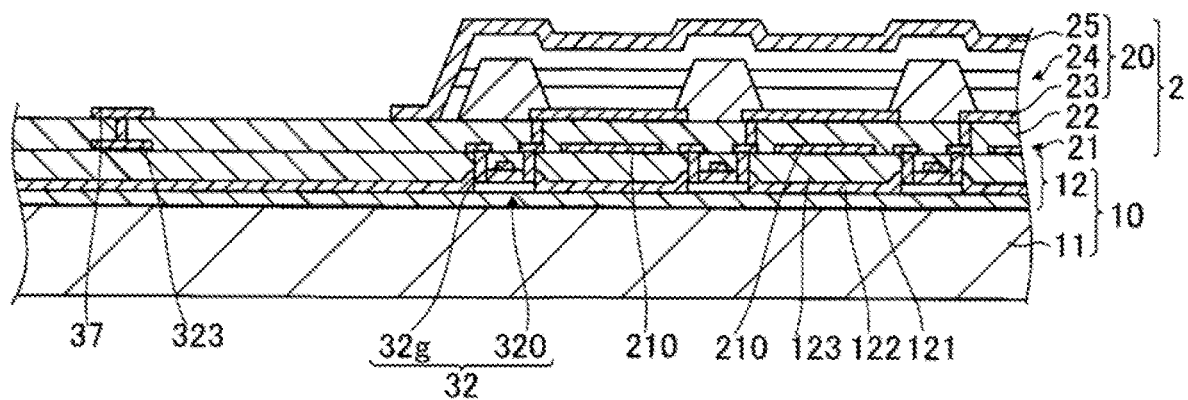
FIG. 9 is a cross-sectional view illustrating a substrate formation step and a light-emitting portion formation step according to the first embodiment.

FIG. 9 is a cross-sectional view illustrating the substrate formation step S11 and the light-emitting portion formation step S12 according to the first embodiment. In the substrate formation step S11, the substrate main body 11 formed of a silicon plate or the like is prepared, and the wiring layer 12 is formed on the substrate main body 11. Specifically, various wiring lines and the like, such as the driving transistor 32, are formed by, for example, forming a metal film by a sputtering method or a vapor deposition method, and patterning the metal film by a photolithography method. Further, the insulating films 121, 122, and 123 are each formed by forming an insulating film by a CVD method or the like, and performing flattening treatment on the insulating film by a polishing method such as a chemical mechanical polishing (CMP) method.

Light-Emitting Portion Formation Step S12

The light-emitting portion formation step S12 includes a reflection layer formation step, a resonance adjusting layer formation step, and a light-emitting element formation step as a "step of forming an organic EL element".

First, in the reflection layer formation step, the reflection layer 21 is formed on the insulating film 123. The reflection layer 21 is formed by, for example, forming a metal film by a sputtering method or a vapor deposition method, and patterning the metal film by a photolithography method. Further, at this time, the relay electrodes 321 and 322 are also formed. Although not illustrated, the relay electrode 323 located in the non-light-emitting region A20 is also formed.

Next, in the resonance adjustment layer formation step, the resonance adjustment layer 22 is formed on the insulating film 123 so as to cover the reflection layer 21. The resonance adjustment layer 22 is formed by, for example, forming an insulating film containing an inorganic material such as silicon oxide by vapor phase deposition such as a CVD method, and then performing flattening treatment.

Next, in the light-emitting element formation step, the plurality of light-emitting elements 20 are formed on the resonance adjustment layer 22. Specifically, first, the plurality of anodes 23 are formed on the resonance adjustment layer 22. The method for forming the anode 23 is similar to the method for forming the reflection layer 21. Next, the partition 26 is formed so as to surround the anode 23 in plan view. Specifically, the partition 26 is formed by forming an insulating film by a CVD method or the like, for example, and patterning the insulating film by a photolithography method. Next, the organic layer 24 is formed on the anode 23 and the partition 26. Each layer of the organic layer 24 is formed by, for example, a vapor deposition method. Next, the cathode 25 is formed on the organic layer 24. The method for forming the cathode 25 is similar to the method for forming the organic layer 24. As described above, the light-emitting element 20 is formed.

Protecting Portion Formation Step S13

FIGS. 10 to 13 are cross-sectional views illustrating the protecting portion formation step S13 according to the first embodiment. The protecting portion formation step S13 includes a first layer formation step illustrated in FIGS. 10 and 11, a second layer formation step illustrated in FIG. 12, and a third layer formation step illustrated in FIG. 13. The protecting portion formation step S13 corresponds to a "step of forming a protecting portion".

Figure 10:
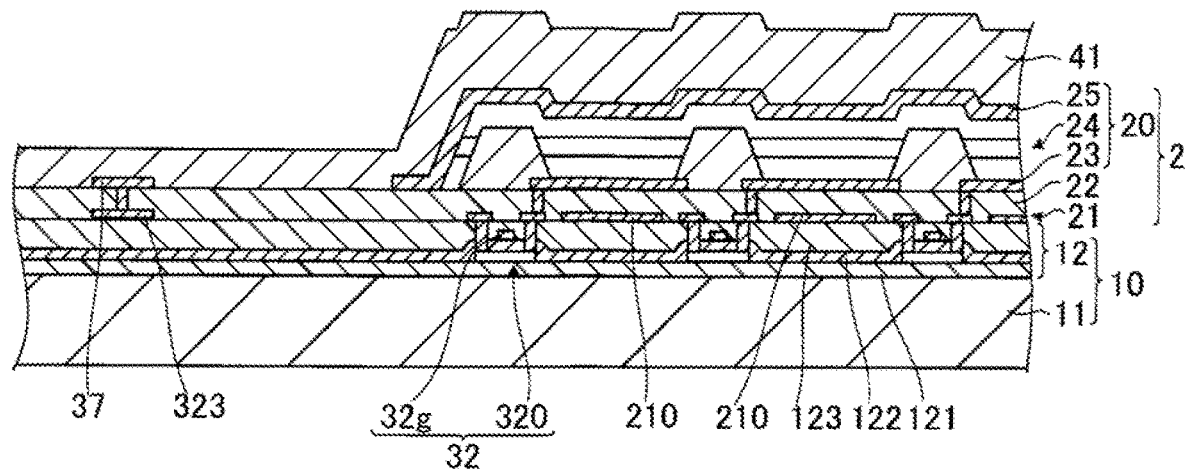
FIG. 10 is a cross-sectional view illustrating the protecting portion formation step according to the first embodiment.
Figure 11:
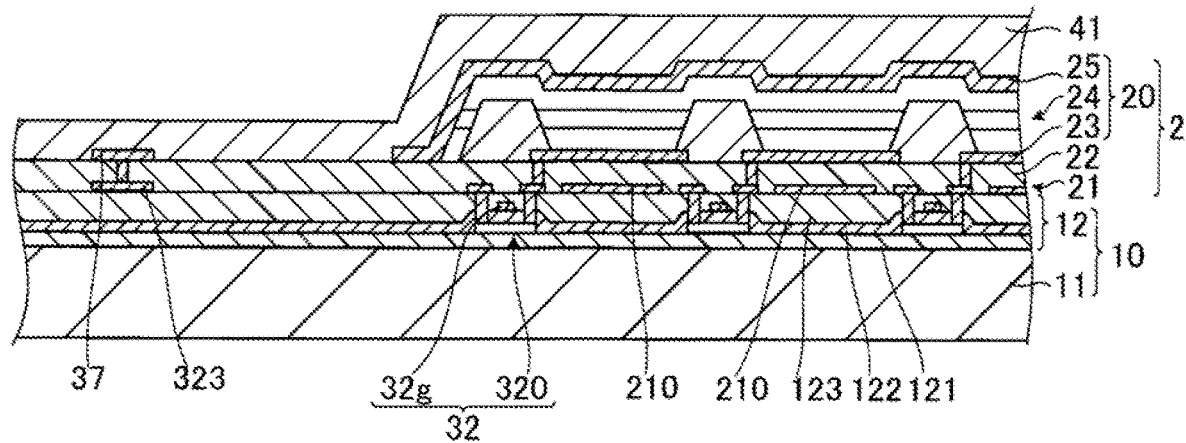
FIG. 11 is a cross-sectional view illustrating the protecting portion formation step according to the first embodiment.

First, as illustrated in FIG. 10, in the first layer formation step, a silicon nitride film 41a is formed on the cathode 25 by an CVD method using plasma, for example. Note that a film mainly composed of a silicon-based inorganic material containing nitrogen other than the silicon nitride film 41a may be formed. As illustrated in FIG. 11, the first layer 41 is formed by the processing. Further, a film formation speed can be increased by using the CVD method as compared to a case in which an ALD method is used, and thus film formation time of the first layer 41 can be shortened. Further, a film can be formed at a lower temperature by using plasma in the CVD method as compared to a case in which the plasma is not used. Further, a risk of cracking or the like generated in the first layer 41 can be reduced by reducing stress on the first layer 41. Further, in the present step, a film is formed such that a thickness of the first layer 41 falls within the above-described range.

Figure 12:
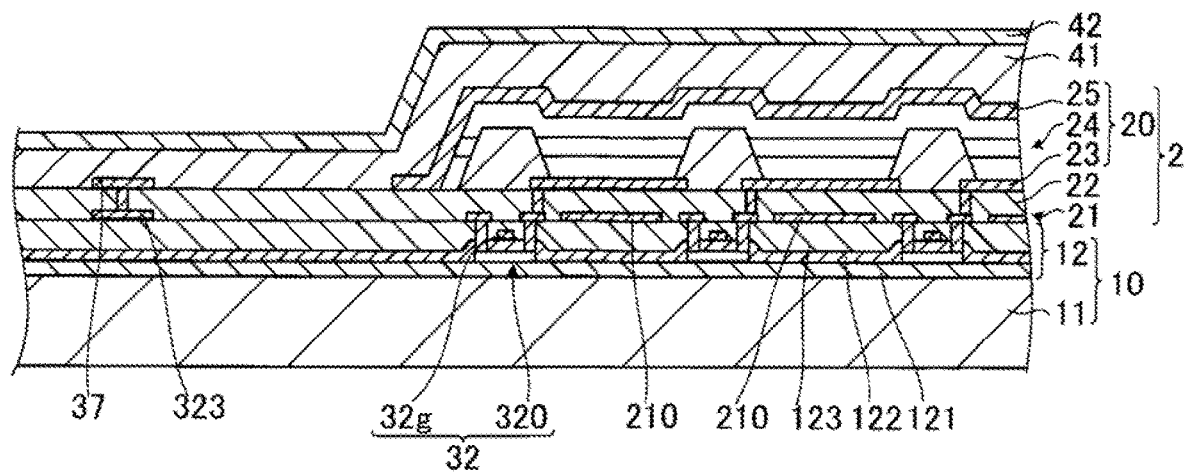
FIG. 12 is a cross-sectional view illustrating the protecting portion formation step according to the first embodiment.

Next, as illustrated in FIG. 12, in the second layer formation step, the second layer 42 is formed on the first layer 41 by an ALD method using plasma, for example. When the second layer 42 is silicon oxide, a raw material for forming the second layer 42 may be an aminosilane-based material. On the other hand, when the second layer 42 is aluminum oxide, trimethylaluminum, for example, is used as a raw material. Further, by using the ALD method, even when a defect occurs in the first layer 41 formed by the CVD method, the defect can be complemented by the second layer 42 to fill the defect. Further, a plasma may be used in the ALD method. A film can be formed at a lower temperature by using the plasma. As a result, stress on the second layer 42 can be reduced. Further, in the present step, a film is formed such that a thickness of the second layer 42 falls within the above-described range.

Figure 13:
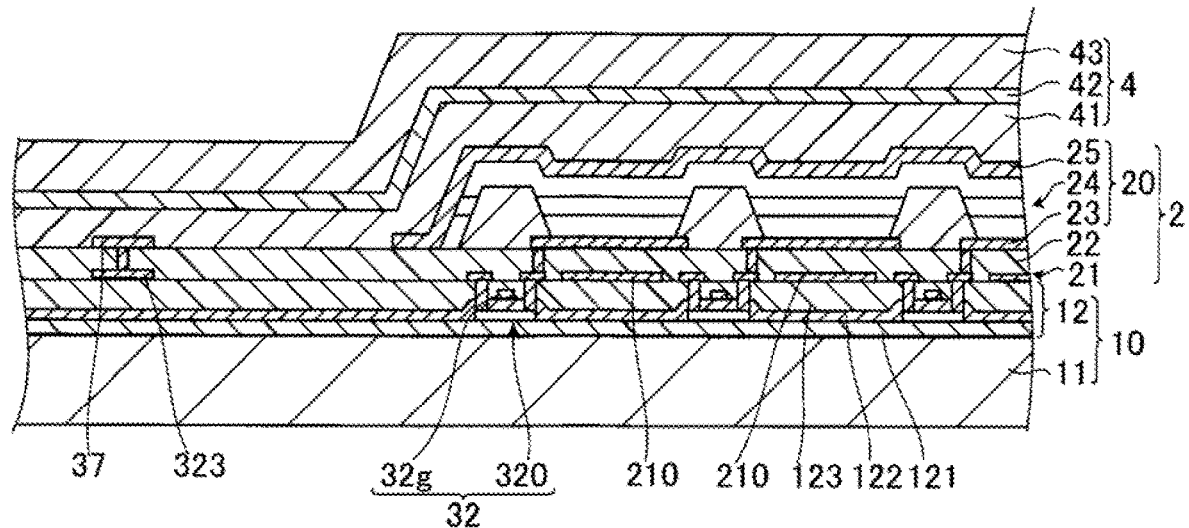
FIG. 13 is a cross-sectional view illustrating the protecting portion formation step according to the first embodiment.

Next, as illustrated in FIG. 13, the third layer 43 is formed on the second layer 42 by a CVD method using plasma, for example. The method for forming the third layer 43 is similar to the method for forming the first layer 41.

Color Filter Layer Formation Step S14

FIGS. 14 to 17 are each a diagram illustrating the color filter layer formation step S14 according to the first embodiment. In the color filter layer formation step S14, the color filter layer 6 is formed on the protecting portion 4.

Figure 14:
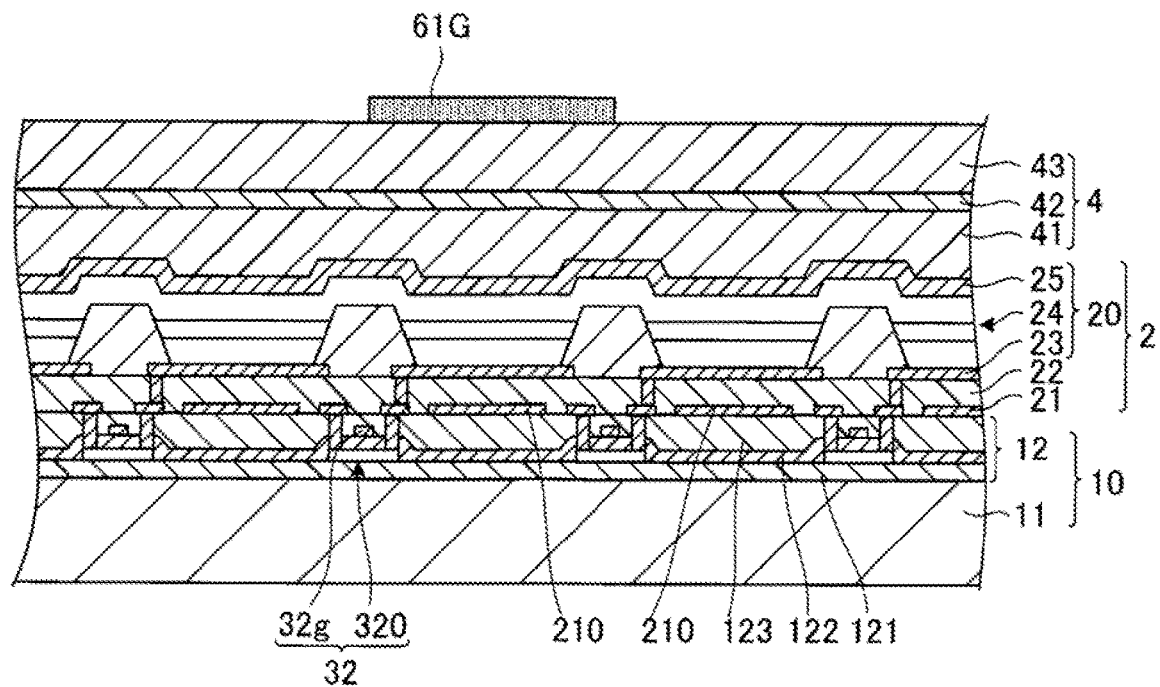
FIG. 14 is a diagram illustrating the color filter layer formation step according to the first embodiment.
Figure 15:
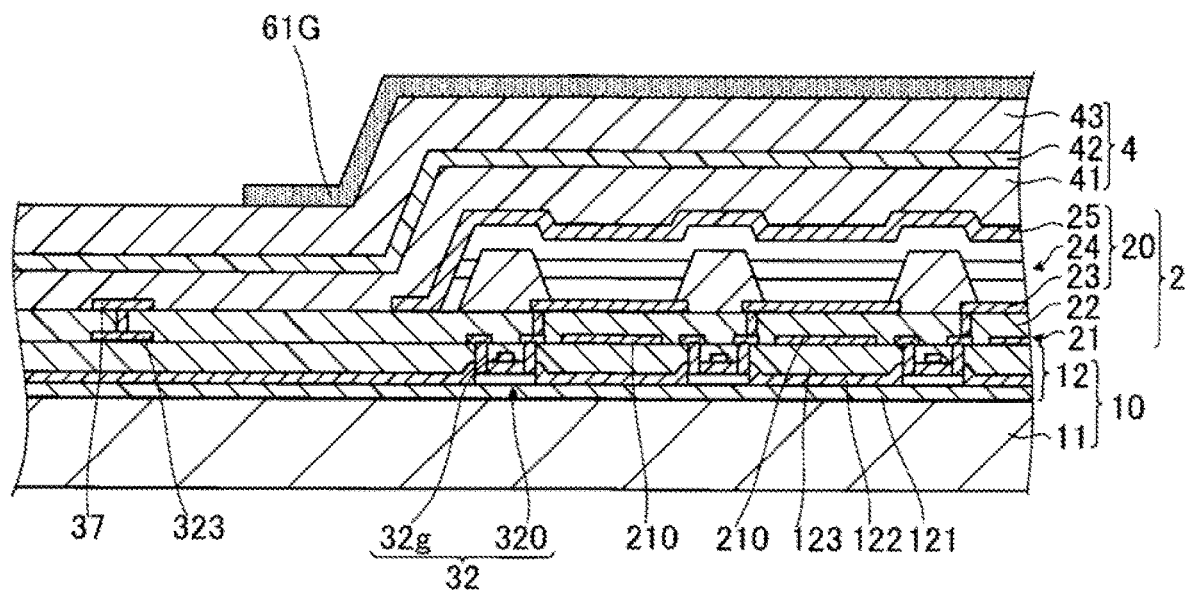
FIG. 15 is a diagram illustrating the color filter layer formation step according to the first embodiment.

Specifically, first, the colored layer 61G illustrated in FIGS. 14 and 15 is formed. For example, a green resin layer is formed by applying a photosensitive resin containing a green color material to the third layer 43 by a spin coating method, and drying the photosensitive resin. Then, a portion of the green resin layer that forms the colored layer 61G is exposed, and an unexposed portion of the resin layer is removed by an alkaline developer or the like. Then, the colored layer 61G is formed by curing the green resin layer.

Figure 16:
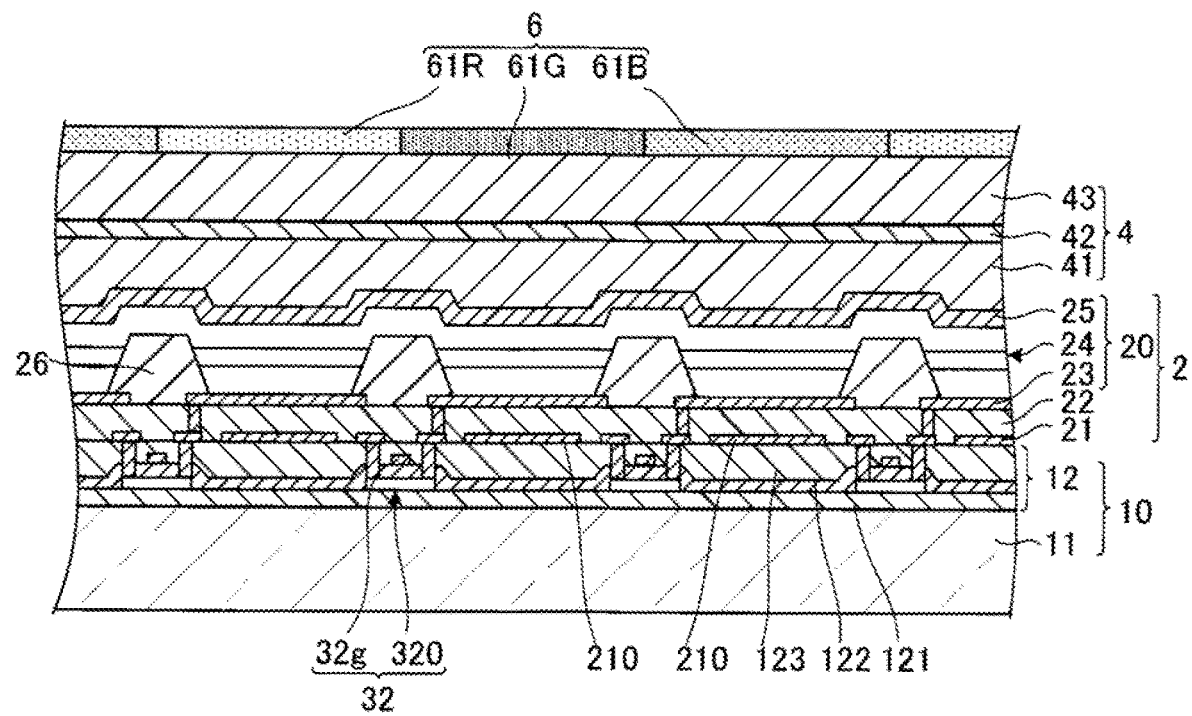
FIG. 16 is a diagram illustrating the color filter layer formation step according to the first embodiment.
Figure 17:
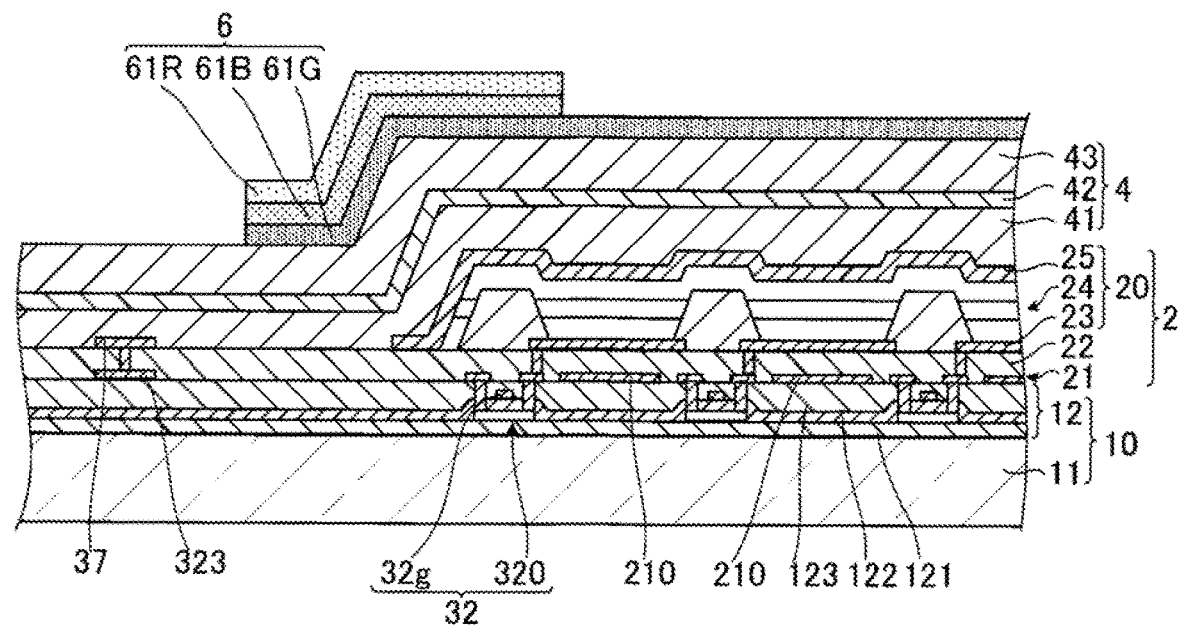
FIG. 17 is a diagram illustrating the color filter layer formation step according to the first embodiment.

Similarly to the formation of the colored layer 61G, the colored layer 61B and the colored layer 61R illustrated in FIGS. 16 and 17 are formed. Specifically, for example, a blue resin layer is formed by applying a photosensitive resin containing a blue color material to the colored layer 61G by a spin coating method, and drying the photosensitive resin. Next, a portion of the blue resin layer that forms the colored layer 61R is exposed, and an unexposed portion of the resin layer is removed by an alkaline developer or the like. Then, the colored layer 61B is formed by curing the blue resin layer. Next, for example, a red resin layer is formed by applying a photosensitive resin containing a red color material by a spin coating method, and drying the photosensitive resin. Then, a portion of the red resin layer that forms the colored layer 61R is exposed, and an unexposed portion of the resin layer is removed by an alkali developer or the like. Then, the colored layer 61R is formed by curing the red resin layer. Note that the colored layer 61G, the colored layer 61B, and the colored layer 61R in the light-emitting region A10 are formed so as to be disposed at locations different from each other on a surface of the protecting portion 4 on the +z-axis side. However, the colored layer 61G, the colored layer 61B, and the colored layer 61R may have portions that partially overlap each other.

Etching Step S15

Figure 18:
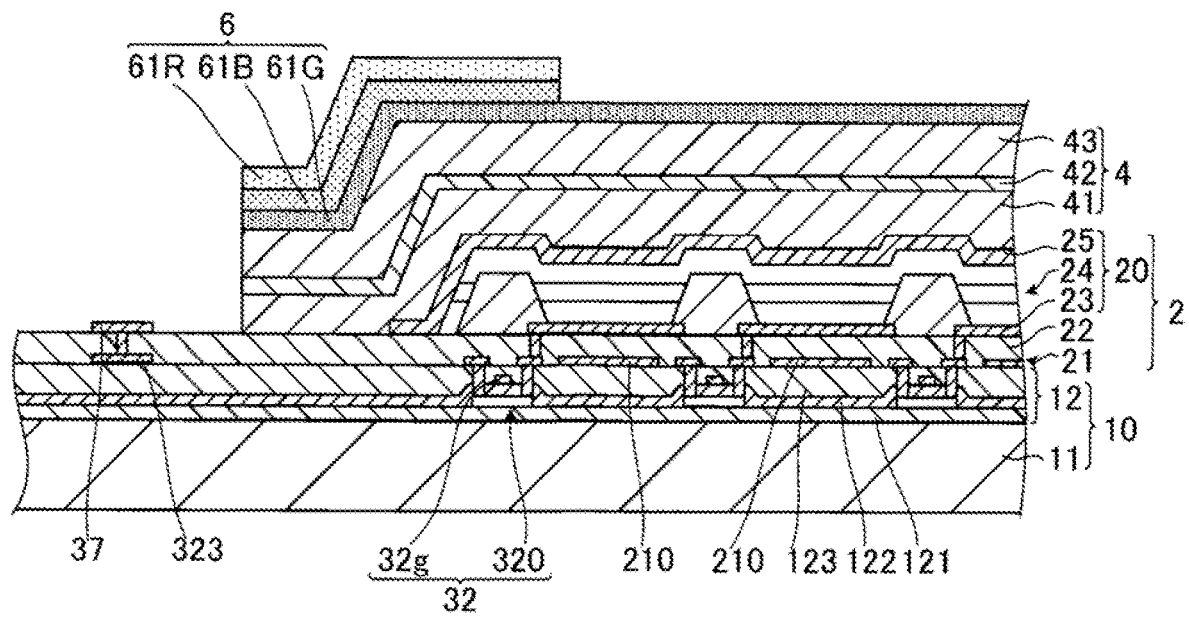
FIG. 18 is a diagram illustrating an etching step according to the first embodiment.

FIG. 18 is a diagram illustrating the etching step S15 according to the first embodiment. In the etching step S15, as illustrated in FIG. 18, a region corresponding to the terminal 37 of the protecting portion 4, and specifically, a region of the protecting portion 4 overlapping the terminal 37 in plan view is removed. The removal of the region is performed by, for example, forming a resist pattern (not illustrated) by a photolithography method, and performing dry etching by using the resist pattern. When the second layer 42 is made of silicon oxide, the first layer 41, the second layer 42, and the third layer 43 can be collectively etched by using the same etching gas.

Note that the formation of the resist pattern described above may be omitted, and, in this case, dry etching processing may be performed by using an insulator, such as glass, as a mask. Further, wet etching may be performed instead of dry etching. Further, the etching step S15 may be performed before the color filter layer formation step S14. Furthermore, the etching may be wet etching.

Transmissive Substrate Adhesion Step S16

Figure 19:
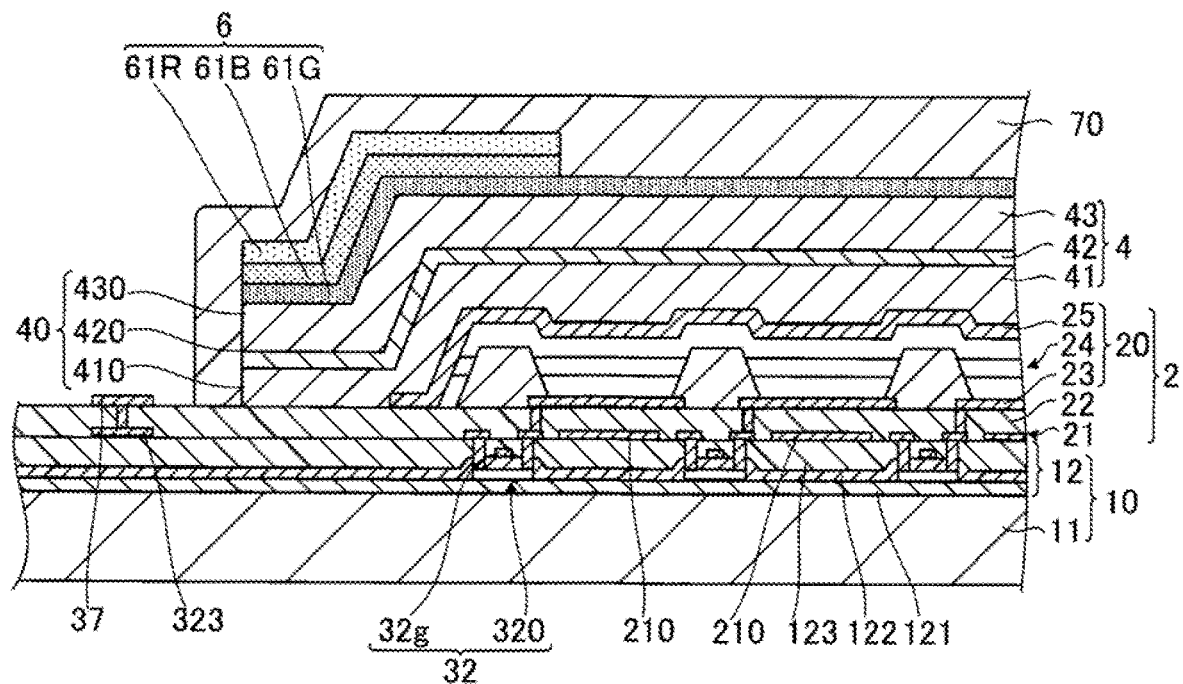
FIG. 19 is a diagram illustrating a transmissive substrate adhesion step according to the first embodiment.

FIG. 19 is a diagram illustrating the transmissive substrate adhesion step S16 in the first embodiment, and is a diagram illustrating application of an adhesive in the transmissive substrate adhesion step S16. In the transmissive substrate adhesion step S16, a transparent resin material is applied onto the color filter layer 6, and the transmissive substrate 7 formed of a glass substrate or the like is disposed on the applied resin material, and then pressed. At this time, for example, when the resin material is a photosensitive resin, the photosensitive resin is cured by irradiating with light via the transmissive substrate 7. By the curing, the adhesive layer 70 formed of a cured product of the resin material is acquired. Further, the transmissive substrate 7 adheres to the color filter layer 6 by the adhesive layer 70.

Here, the adhesive is applied so as to cover the color filter layer 6 and the protecting portion 4 in the application of the adhesive. In other words, the adhesive is applied to the surface of the color filter layer 6 on the +z-axis side and on the outer circumferential surface 40 of the protecting portion 4. A method for applying the adhesive is not particularly limited, and examples thereof include an application method using a dispenser or an application method using a screen mask. By using the application method using a screen mask, the adhesive can be applied to a desired position with high precision.

As described above, the display panel 1 of the organic EL device 100 is manufactured. Note that the organic EL device 100 is acquired by housing the display panel 1 in the case 90 and coupling the display panel 1 to the FPC substrate 95.

As described above, the method for manufacturing the display panel 1 includes the light-emitting portion formation step S12 of forming the light-emitting element 20, the protecting portion formation step S13 of forming the protecting portion 4 that protects the light-emitting element 20, and the transmissive substrate adhesion step S16. Further, in the protecting portion formation step S13, the first layer 41 mainly composed of a silicon-based inorganic material containing nitrogen is formed on the surface on the side opposite to the substrate with respect to the light-emitting element 20, the second layer 42 mainly composed of silicon oxide or aluminum oxide is formed on the side opposite to the light-emitting element 20 with respect to the first layer 41, and the third layer 43 mainly composed of a silicon-based inorganic material containing nitrogen is formed on the surface on the side opposite to the first layer 41 with respect to the second layer 42. In the transmissive substrate adhesion step S16, the second protecting portion 75 serving as the "resin portion" mainly composed of a resin material is formed on the outer circumferential surface 420 as an example of the "side surface" of the second layer 42.

The display panel 1 having a sufficiently thin thickness and excellent sealing performance can be acquired by forming the protecting portion 4 including the first layer 41, the second layer 42, and the third layer 43. Further, the second protecting portion 75 can be formed on the outer circumferential surface 420 of the second layer 42 without using a photolithography method by forming the second protecting portion 75 formed of a resin material. Thus, in the formation of the second protecting portion 75, time and effort of forming a resist pattern by using a mask, performing exposing and developing by using the resist pattern, performing etching, and then peeling the resist pattern can be saved. As a result, the number of manufacturing steps of the display panel 1 can be reduced. Specifically, as described above, the second protecting portion 75 can be formed by applying the adhesive onto the outer circumferential surface 420 of the second layer 42 and curing the adhesive. Thus, the manufacturing process of the display panel 1 can be simplified.

Further, as described above, the first layer 41 is formed by a CVD method using plasma, the second layer 42 is formed by an ALD method using plasma, and the third layer 43 is formed by a CVD method using plasma. Film formation time of the first layer 41 and the third layer 43 having excellent gas barrier properties and a sufficiently thin thickness can be reduced by using the CVD method. Further, the second layer 42 that is sufficiently thin and capable of complementing a defect in the first layer 41 can be suitably formed by using the ALD method. Furthermore, stress on each layer can be reduced by using plasma in each of the methods. As described above, the protecting portion 4 having excellent sealing performance and a sufficiently thin thickness can be easily formed.

The organic EL device 100 according to the present embodiment is described above. Note that the second protecting portion 75 is a part of the adhesive layer 70 in the present embodiment, but the second protecting portion 75 may be separate from the adhesive layer 70. When the second protecting portion 75 and the adhesive layer 70 are formed separately, the etching step S15, the step of forming the second protecting portion 75, and the etching step S15 may be performed in this order.

Further, the protecting portion 4 is constituted of three layers of the first layer 41, the second layer 42, and the third layer 43 in the present embodiment, but the protecting portion 4 may be constituted of four or more layers. In this case, the protecting portion 4 may have a configuration in which the protecting portion 4 includes, on the first layer 41, a plurality of groups of a layer mainly composed of a silicon-based inorganic material containing nitrogen and a layer mainly composed of silicon oxide or aluminum oxide. The sealing performance of the protecting portion 4 can be increased by including the plurality of groups.

Further, the organic EL device 100 may be configured to emit any of light in a blue wavelength region, a green wavelength region, and a red wavelength region. In other words, the organic EL device 100 may be configured to emit only a single color.

1-2. Second Embodiment

Figure 20:
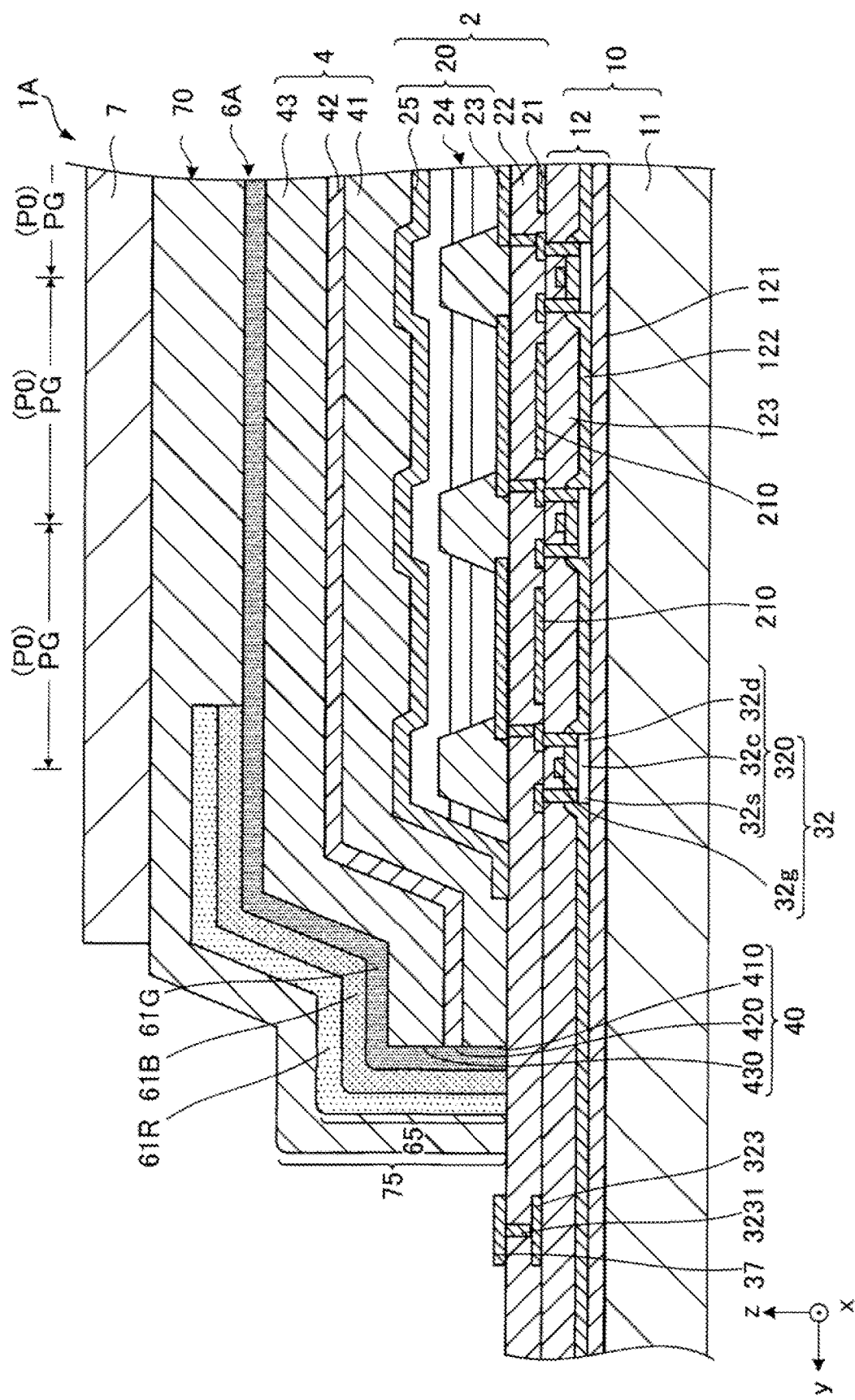
FIG. 20 is a partial cross-sectional view of a display panel according to a second embodiment.

FIG. 20 is a partial cross-sectional view of a display panel 1A according to a second embodiment. The present embodiment is different from the first embodiment in that the present embodiment includes a third protecting portion 65. Note that, in the second embodiment, a sign used in the description of the first embodiment is used for the same matter as that of the first embodiment, and each detailed description thereof will be appropriately omitted.

A color filter layer 6A of the display panel 1A illustrated in FIG. 20 covers a protecting portion 4. The color filter layer 6A is in contact with an outer circumferential surface 420 of a second layer 42. Furthermore, the color filter layer 6A is in contact with an outer circumferential surface 410 of a first layer 41 and an outer circumferential surface 430 of a third layer 43. In other words, in the present embodiment, the color filter layer 6A is in contact with an outer circumferential surface 40 of the protecting portion 4. A portion of the color filter layer 6A being in contact with the outer circumferential surface 40 of the protecting portion 4 constitutes the third protecting portion 65. In other words, the color filter layer 6A includes the third protecting portion 65. The third protecting portion 65 is an example of a "resin portion", and is mainly composed of a resin material. By including the third protecting portion 65, the outer peripheral surface 40 of the protecting portion 4 can be prevented from being exposed, and the protecting portion 4 can be protected. The light-emitting element 20 can be covered with the protecting portion 4 and the color filter layer 6A by including the third protecting portion 65. Thus, moisture, oxygen, or the like in the atmosphere can be prevented from entering a light-emitting element 20 as compared to a case in which the third protecting portion 65 is not included.

As described above, the display panel 1A includes the color filter layer 6A that is disposed on a side opposite to the light-emitting element 20 with respect to the protecting portion 4 and transmits light having a predetermined wavelength. The color filter layer 6A includes the third protecting portion 65 as a "resin portion" mainly composed of a resin material.

The third protecting portion 65 can be formed on the outer circumferential surface 40 of the protecting portion 4 without using a photolithography method by forming the third protecting portion 65 mainly composed of a resin material. Thus, the number of manufacturing steps of the display panel 1A can be reduced. Further, since the third protecting portion 65 is a part of the color filter layer 6A, the third protecting portion 65 is formed by forming the color filter layer 6A. Thus, the number of manufacturing steps of the display panel 1A can be reduced as compared to a case in which the third protecting portion 65 and the color filter layer 6A are formed separately.

Further, in the present embodiment, a second protecting portion 75 is disposed on the third protecting portion 65.

Thus, the display panel 1 having excellent sealing performance can be provided as compared to a case in which the second protecting portion 75 is not disposed on the third protecting portion 65. Note that, when the third protecting portion 65 is provided, the second protecting portion 75 may be omitted. In other words, an adhesive layer 70 may be provided only on a surface of the color filter layer 6A on the +z-axis side. Further, the third protecting portion 65 may be disposed on at least the outer circumferential surface 420 of the second layer 42, and may not be disposed on the outer circumferential surface 410 of the first layer 41 and on the outer circumferential surface 430 of the third layer 43.

1-3. Third Embodiment

Figure 21:
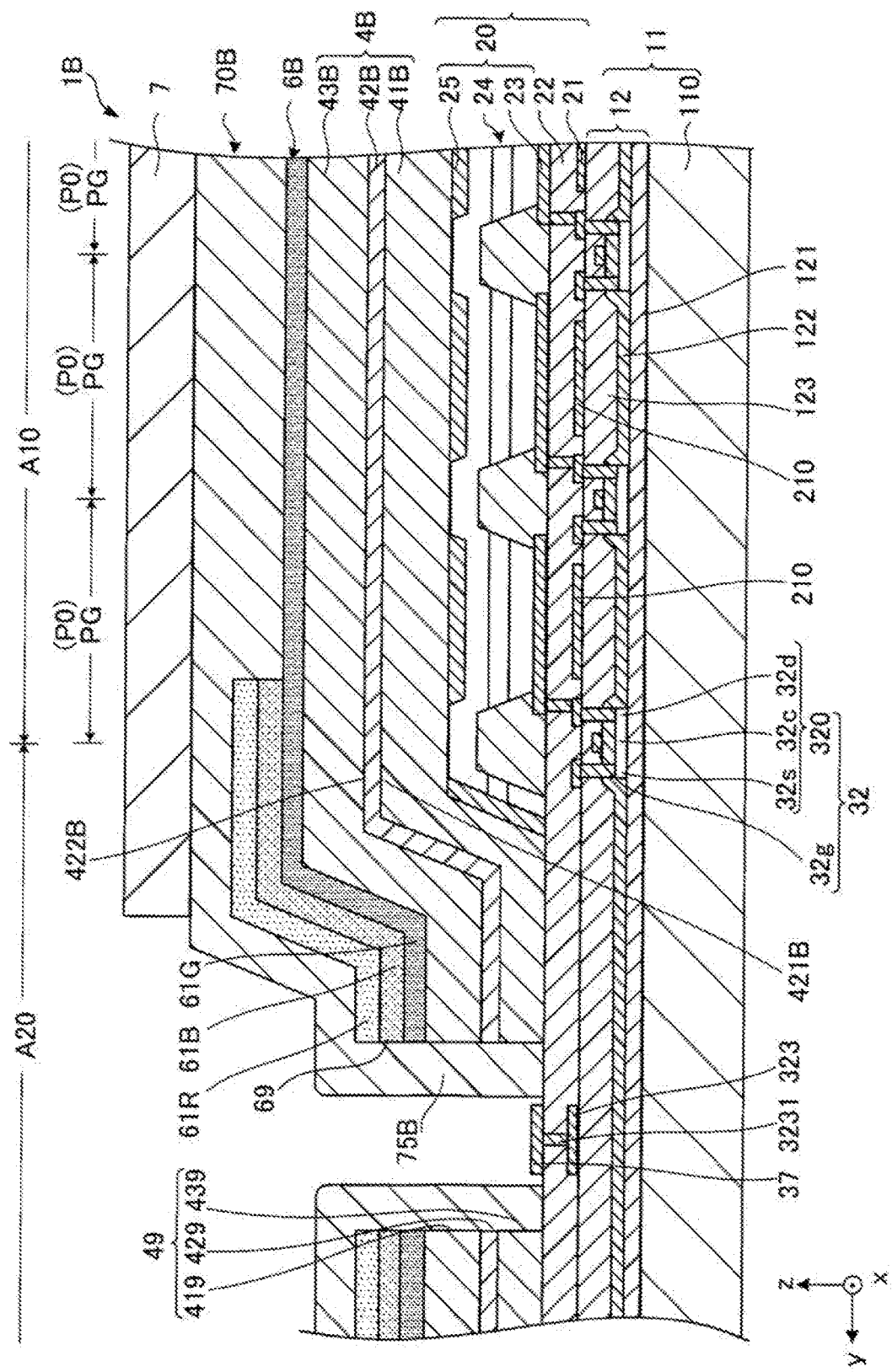
FIG. 21 is a partial cross-sectional view of a display panel according to a third embodiment.
Figure 22:
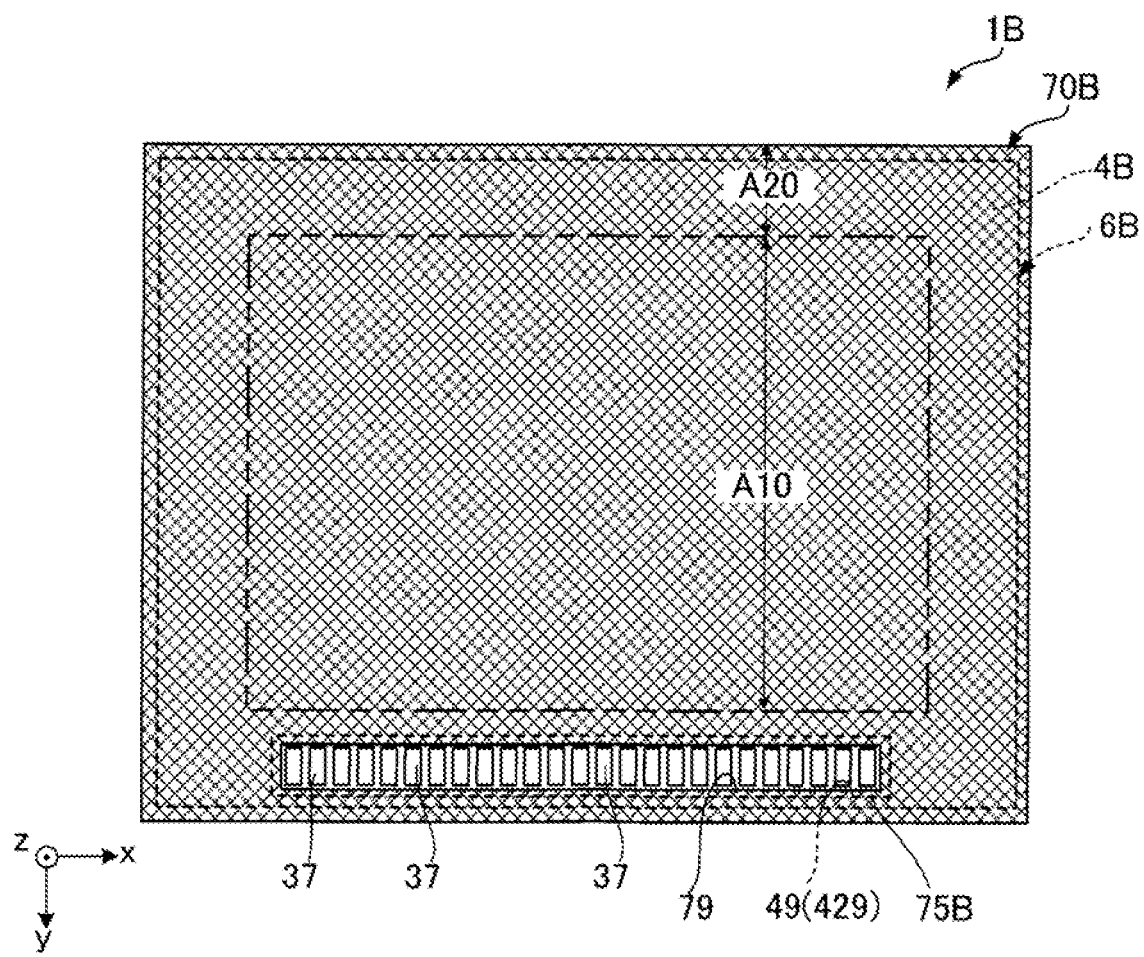
FIG. 22 is a plan view of the display panel according to the third embodiment.

FIG. 21 is a partial cross-sectional view of a display panel 1B according to a third embodiment. FIG. 22 is a plan view of the display panel 1B according to the third embodiment. The present embodiment is mainly different from the first embodiment in that a protecting portion 4B includes an opening 49. Note that, in the second embodiment, a sign used in the description of the first embodiment is used for the same matter as that of the first embodiment, and each detailed description thereof will be appropriately omitted. Further, a transmissive substrate 7 is not illustrated in FIG. 22. Further, in FIG. 22, shading is provided to an adhesive layer 70B in order to facilitate understanding of the arrangement of the adhesive layer 70B.

As illustrated in FIGS. 21 and 22, the opening 49 that overlaps a plurality of terminals 37 in plan view is provided in the protecting portion 4B of the display panel 1B. The opening 49 is a space that penetrates the protecting portion 4B. The opening 49 is formed by an inner circumferential surface 419 of a first layer 41B, an inner circumferential surface 429 of a second layer 42B, and an inner circumferential surface 439 of a third layer 43B. Further, a second opening 69 that overlaps the plurality of terminals 37 in plan view is provided in the color filter layer 6B. The second opening 69 is a space that penetrates the color filter layer 6B, and communicates with the opening 49. A third opening 79 that overlaps the plurality of terminals 37 in plan view is provided in the adhesive layer 70B. The third opening 79 is a space that penetrates the adhesive layer 70B, and communicates with the opening 49.

The adhesive layer 70B is disposed in a range wider than the color filter layer 6B and the protecting portion 4B in plan view, and wraps the color filter layer 6B and the protecting portion 4B. Note that the protecting portion 4B overlaps the color filter layer 6B in plan view. Further, the adhesive layer 70B is in contact with the inner circumferential surface 429 of the second layer 42B. The inner circumferential surface 429 is an example of a "side surface" of the second layer 42B, and is a surface that connects a first main surface 421B of the second layer 42B on the −z-axis side and a second main surface 422B on the +z-axis side. Furthermore, in the present embodiment, the adhesive layer 70B is in contact with the inner circumferential surface 419 of the first layer 41B and the inner circumferential surface 439 of the third layer 43B. A portion of the adhesive layer 70B being in contact with the inner circumferential surfaces 419, 429, and 439 constitutes the second protecting portion 75B. Also, in the present embodiment, the protecting portion 4B including the second layer 42B can be protected by the second protecting portion 75B by providing the adhesive layer 70B, similarly to the first embodiment.

2. Electronic Apparatus

The organic EL device 100 of the above-described embodiments is applicable to various electronic apparatuses.

2-1. Head-Mounted Display

Figure 23:
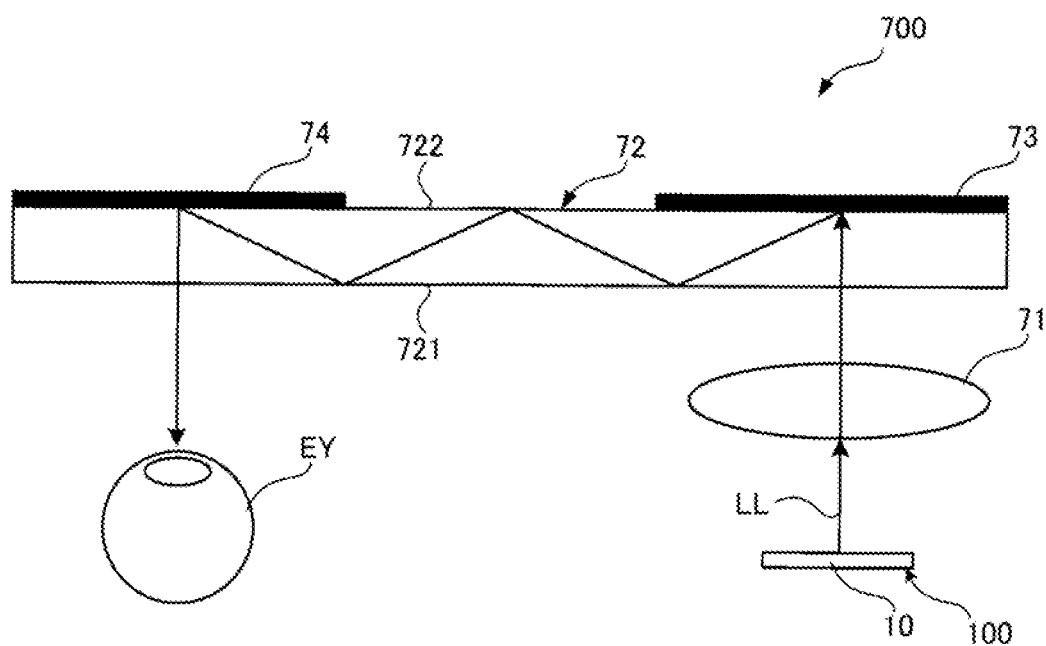
FIG. 23 is a plan view schematically illustrating a part of a virtual display apparatus as an example of an electronic apparatus in the present disclosure.

FIG. 23 is a plan view schematically illustrating a part of a virtual display apparatus 700 as an example of an electronic apparatus in the present disclosure. The virtual display apparatus 700 illustrated in FIG. 23 is a head-mounted display (HMD) mounted on a head of an observer and configured to display an image. The virtual display apparatus 700 includes the organic EL device 100 described above, a collimator 71, a light guide 72, a first reflection-type volume hologram 73, and a second reflection-type volume hologram 74. Note that light emitted from the organic EL device 100 is emitted as image light LL.

The collimator 71 is disposed between the organic EL device 100 and the light guide 72. The collimator 71 collimates light emitted from the organic EL device 100. The collimator 71 is constituted of a collimating lens or the like. The light collimated by the collimator 71 is incident on the light guide 72.

The light guide 72 has a flat plate shape, and is disposed so as to extend in a direction intersecting a direction of light incident via the collimator 71. The light guide 72 reflects and guides light therein. A light incident port on which light is incident and a light emission port from which light is emitted are provided in a surface 721 of the light guide 72 facing the collimator 71. The first reflection-type volume hologram 73 as a "diffractive optical element" and the second reflection-type volume hologram 74 as a "diffractive optical element" are disposed on a surface 722 of the light guide 72 opposite to the surface 721. The first reflection-type volume hologram 73 is provided closer to the light emission port side than the second reflection-type volume hologram 74. The first reflection-type volume hologram 73 and the second reflection-type volume hologram 74 have interference fringes corresponding to a predetermined wavelength region, and diffract and reflect light in the predetermined wavelength region.

In the virtual display apparatus 700 having such a configuration, the image light LL incident on the light guide 72 from the light incident port travels while being repeatedly reflected, and is guided to an eye EY of the observer, and thus the observer can observe an image constituted of a virtual image formed by the image light LL.

Here, the virtual display apparatus 700 includes the above-described organic EL device 100. The above-described organic EL device 100 has excellent sealing performance and good quality. Thus, a high-quality virtual display apparatus 700 can be provided by including the organic EL device 100.

Note that the virtual display apparatus 700 may include a synthetic element such as a dichroic prism configured to synthesize light emitted from the organic EL device 100. In this case, the virtual display apparatus 700 may include, for example, the organic EL device 100 configured to emit light in a blue wavelength region, the organic EL device 100 configured to emit light in a green wavelength region, and the organic EL device 100 configured to emit light in a red wavelength region.

2-2. Personal Computer

Figure 24:
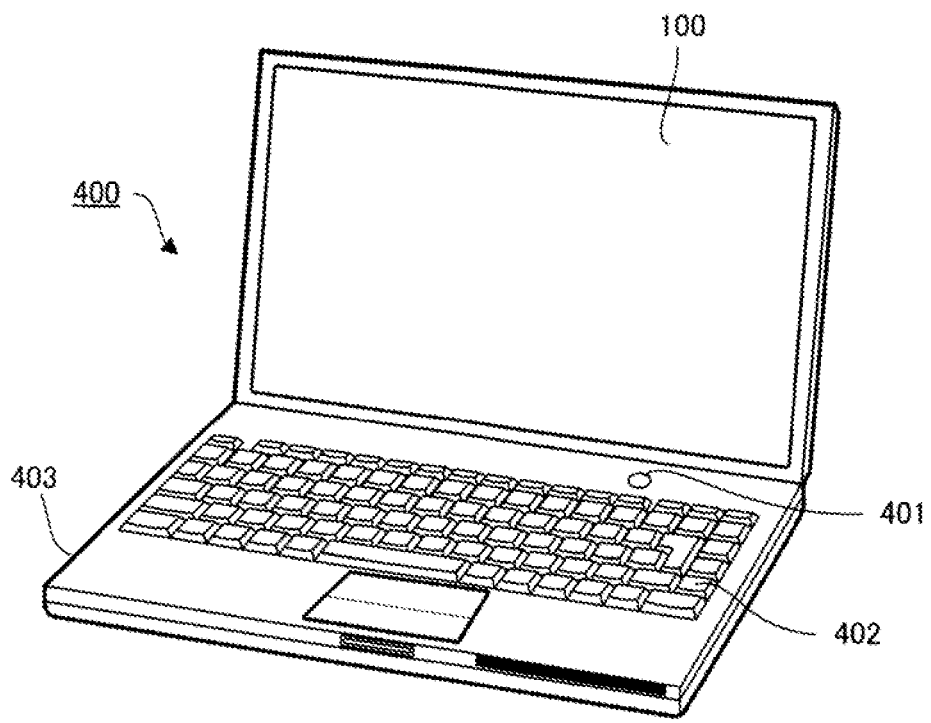
FIG. 24 is a perspective view illustrating a personal computer as an example of the electronic apparatus in the present disclosure.

FIG. 24 is a perspective view illustrating a personal computer 400 as an example of the electronic apparatus in the present disclosure. The personal computer 400 includes the organic EL device 100, and a main body 403 provided with a power switch 401 and a keyboard 402. The personal computer 400 includes the above-described organic EL device 100, and thus has excellent quality.

Note that examples of the "electronic apparatus" including the organic EL device 100 include, in addition to the virtual display apparatus 700 illustrated in FIG. 23 and the personal computer 400 illustrated in FIG. 24, an apparatus arranged close to eyes such as a digital scope, a digital binocular, a digital still camera, and a video camera. Further, the "electronic apparatus" including the organic EL device 100 is applied as a mobile phone, a smartphone, a Personal Digital Assistant (PDA), a car navigation device, and a vehicle-mounted display unit. Furthermore, the "electronic device" including the organic EL device 100 is applied as illumination for illuminating light.

The present disclosure was described above based on the illustrated embodiments. However, the present disclosure is not limited thereto. In addition, the configuration of each component of the present disclosure may be replaced with any configuration that exerts the equivalent functions of the above-described embodiments, and to which any configuration may be added. Further, any configuration may be combined with each other in the above-described embodiments of the present disclosure.

What is claimed is:

1. An organic electroluminescence device, comprising:
a substrate;
an organic electroluminescence element disposed on the substrate;
a protecting portion configured to protect the organic electroluminescence element;
a transmissive substrate disposed on a side opposite to the organic electroluminescence element with respect to the protecting portion;
a color filter disposed between the protecting portion and the transmissive substrate, the color filter including:
a first colored layer that transmits light in a first wavelength region;
a second colored layer that transmits light in a second wavelength region; and
a third colored layer that transmits light in a third wavelength region; and
an adhesive layer disposed between the color filter and the transmissive substrate, wherein
the protecting portion includes
a first layer disposed on a side opposite to the substrate with respect to the organic electroluminescence element, and mainly composed of a silicon-based inorganic material containing nitrogen,
a second layer disposed on a side opposite to the organic electroluminescence element with respect to the first layer, and mainly composed of silicon oxide or aluminum oxide, and
a third layer disposed on a side opposite to the first layer with respect to the second layer, and mainly composed of a silicon-based inorganic material containing nitrogen,
the color filter includes a first resin portion that covers a side surface of the first layer, a side surface of a second layer and a side surface of a third layer, wherein the first colored layer is continuous from the first resin portion to a light-emitting region,
the adhesive layer includes a second resin portion that covers the first resin portion,
in a planar direction of the substrate, the first colored layer in the first resin portion is between the second resin portion and the side surface of the second layer and is in contact with the side surface of the second layer,
in the planar direction, the second colored layer in the first resin portion is between the first colored layer in the first resin portion and the second resin portion and is in contact with the first colored layer in the first resin portion, and
in the planar direction, the third colored layer in the first resin portion is between the second colored layer in the first resin portion and the second resin portion and is in contact with the second colored layer in the first resin portion.

2. An electronic apparatus comprising the organic electroluminescence device according to claim 1.

3. The organic electroluminescence device according to claim 1, wherein
the side surface of the first layer, the side surface of the second layer, and the side surface of the third layer together form a continuous surface.

4. A method for manufacturing an organic electroluminescence device, comprising:
forming an organic electroluminescence element on a substrate;
forming a protecting portion configured to protect the organic electroluminescence element;
forming a color filter including:
forming a first colored layer configured to transmit light in a first wavelength region;
forming a second colored layer configured to transmit light in a second wavelength region; and
forming a third colored layer configured to transmit light in a third wavelength region; and
forming an adhesive layer, wherein
the formation of the protecting portion includes
forming a first layer on the organic electroluminescence element, the first layer mainly composed of a silicon-based inorganic material containing nitrogen,
forming a second layer on the first layer, the second layer mainly composed of silicon oxide or aluminum oxide, and
forming a third layer on the second layer, the third layer mainly composed of a silicon-based inorganic material containing nitrogen,
the formation of the color filter includes formation a first resin portion that covers a side surface of the first layer, a side surface of a second layer and a side surface of a third layer,
the formation of the adhesive layer includes formation of a second resin portion covering cover the first resin portion, and
the formation of the first resin portion includes:
forming the first colored layer in the first resin portion between the second resin portion and the side surface of the second layer in a planar direction of the substrate and in contact with the side surface of the second layer, wherein the first colored layer is continuous from the first resin portion to a light-emitting region,
forming the second colored layer in the first resin portion between the second resin portion and the first colored layer in the first resin portion in the planar direction and in contact with the first colored layer in the first resin portion, and
forming the third colored layer in the first resin portion between the second resin portion and the second colored layer in the first resin portion in the planar direction and in contact with the second colored layer in the first resin portion.

5. The method for manufacturing an organic electroluminescence device according to claim 4, wherein
the first layer is formed by chemical vapor deposition using plasma,
the second layer is formed by atomic layer deposition using plasma, and
the third layer is formed by chemical vapor deposition using plasma.

6. The method for manufacturing an organic electroluminescence device according to claim 4, wherein
the side surface of the first layer, the side surface of the second layer, and the side surface of the third layer together form a continuous surface.

\* \* \* \* \*